United States Patent
Caspary et al.

(10) Patent No.: US 7,867,912 B2
(45) Date of Patent: Jan. 11, 2011

(54) METHODS OF MANUFACTURING SEMICONDUCTOR STRUCTURES

(75) Inventors: Dirk Caspary, Dresden (DE); Arnd Scholz, Dresden (DE); Stefano Parascandola, Dresden (DE); Christoph Nölscher, Nürnberg (DE)

(73) Assignee: Qimonda AG, Munich (DE)

( * ) Notice: Subject to any disclaimer, the term of this patent is extended or adjusted under 35 U.S.C. 154(b) by 996 days.

(21) Appl. No.: 11/676,635

(22) Filed: Feb. 20, 2007

(65) Prior Publication Data

US 2008/0197394 A1    Aug. 21, 2008

(51) Int. Cl.
*H01L 21/302* (2006.01)
*H01L 21/461* (2006.01)

(52) U.S. Cl. .................................. 438/717; 438/708
(58) Field of Classification Search ......... 438/689–717, 438/E21.231, E21.232
See application file for complete search history.

(56) References Cited

U.S. PATENT DOCUMENTS

| | | | |
|---|---|---|---|
| 5,916,821 A | 6/1999 | Kerber | |
| 6,982,221 B1 | 1/2006 | Hsu | |
| 7,759,242 B2 * | 7/2010 | Meyer et al. ................. | 438/618 |
| 2005/0100799 A1 | 5/2005 | Hagiwara | |
| 2005/0142497 A1 | 6/2005 | Ryou et al. | |
| 2005/0196685 A1 | 9/2005 | Wang et al. | |
| 2006/0224621 A1 | 10/2006 | Findley et al. | |
| 2009/0053892 A1 * | 2/2009 | Meyer et al. ................. | 438/667 |
| 2010/0001402 A1 * | 1/2010 | Meyer ......................... | 257/773 |

FOREIGN PATENT DOCUMENTS

| | | |
|---|---|---|
| DE | 42 35 702 | 4/1994 |
| DE | 42 36 609 | 5/1994 |
| DE | 10 2004 034 572 | 2/2004 |
| DE | 102 49 216 | 6/2004 |
| DE | 103 01 475 | 7/2004 |
| EP | 1536284 | 6/2005 |
| EP | 1041443 | 8/2006 |

OTHER PUBLICATIONS

German Office for German Patent Application No. 10 2007 016 290.3 mailed Nov. 21, 2007 (3 pages).

* cited by examiner

*Primary Examiner*—Cuong Q Nguyen
(74) *Attorney, Agent, or Firm*—Dicke, Billig, Czaja, PLLC

(57) ABSTRACT

A method of manufacturing semiconductor structures is disclosed. In one embodiment, a first mask is provided above a substrate. The first mask includes first mask lines extending along a first axis. A second mask is provided above the first mask. The second mask includes second mask lines extending along a second axis that intersects the first axis. At least one of the first and second masks is formed by a pitch fragmentation method. Structures may be formed in the substrate, wherein the first and the second mask are effective as a combined mask. The structures may be equally spaced at a pitch in the range of a minimum lithographic feature size for repetitive line structures.

34 Claims, 27 Drawing Sheets

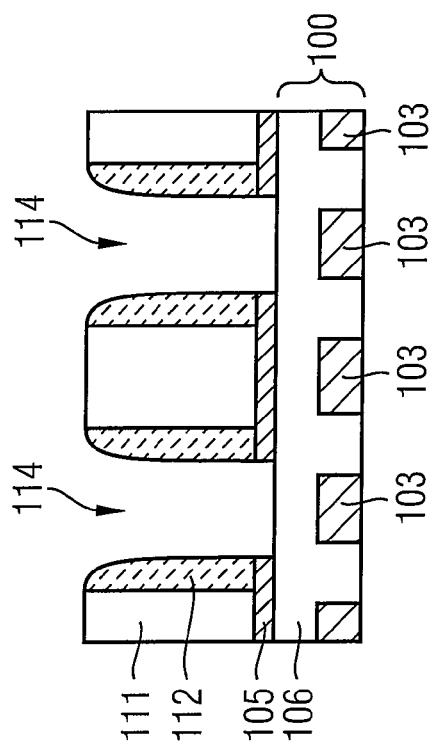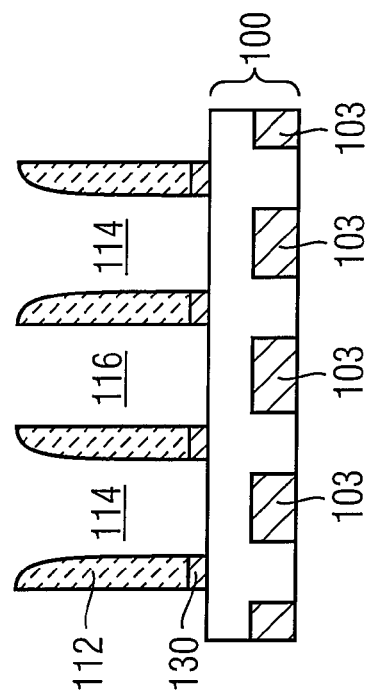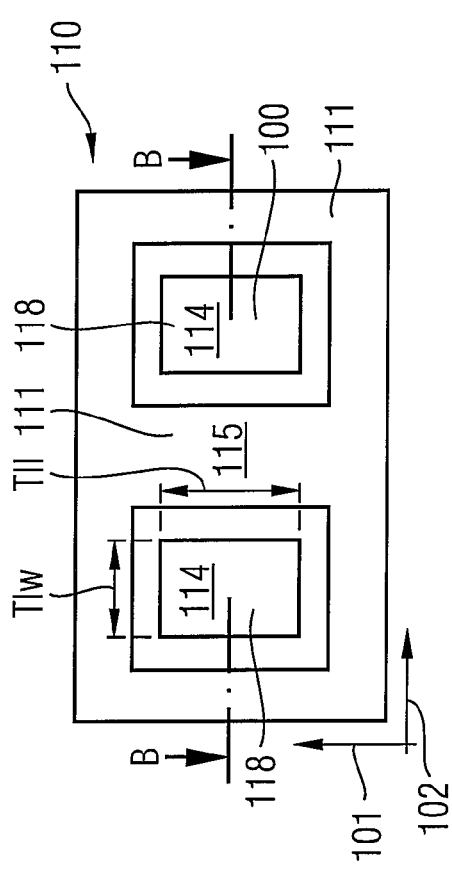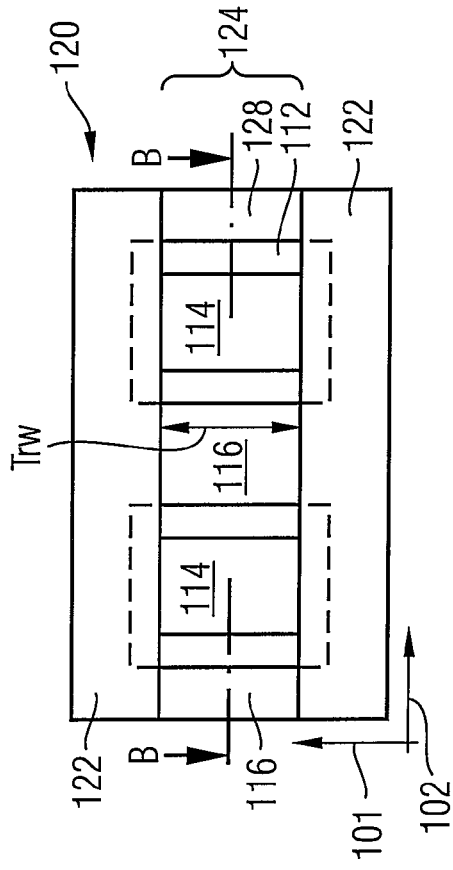

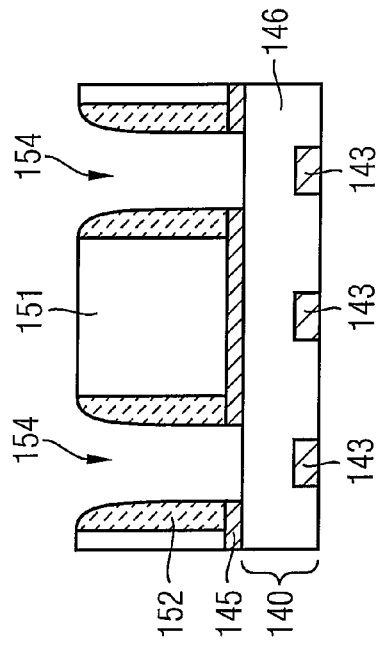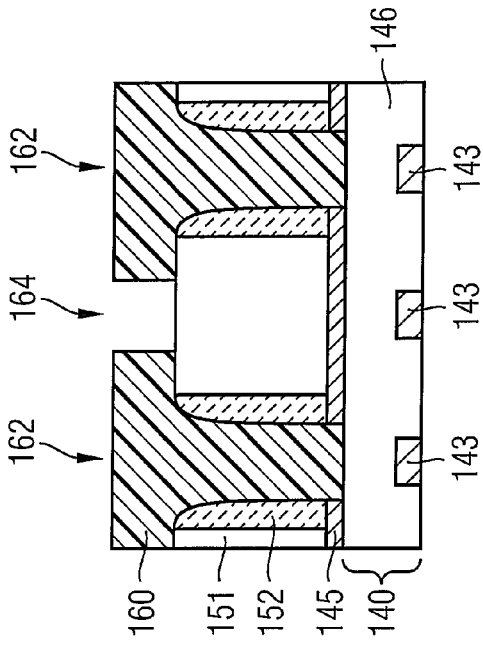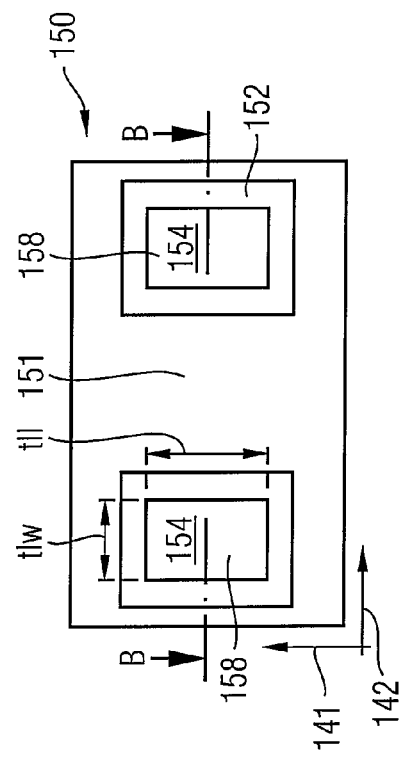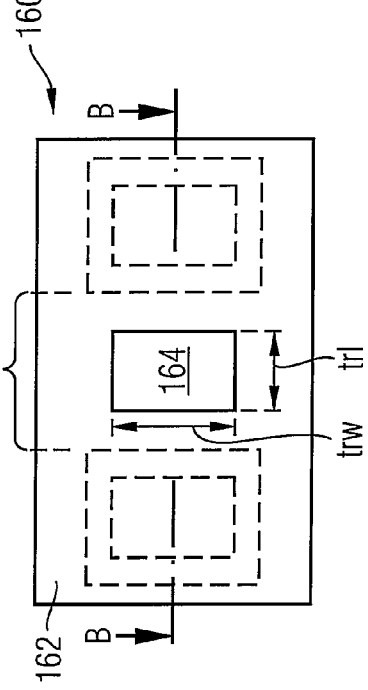

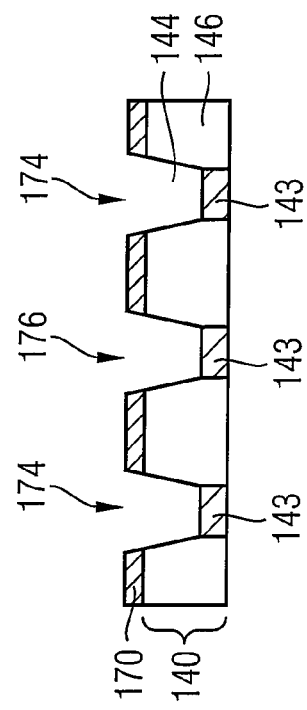
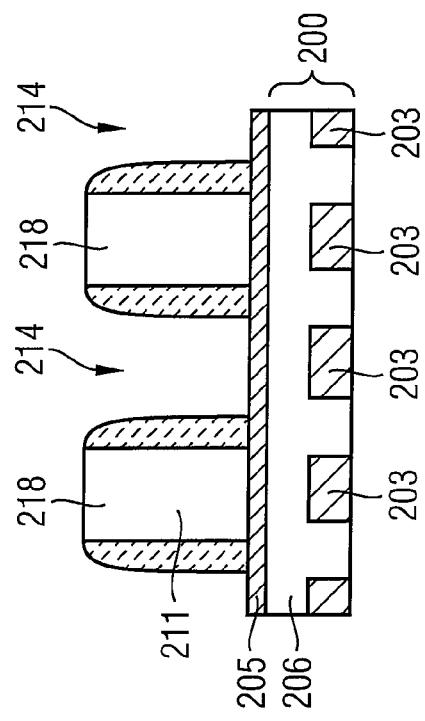
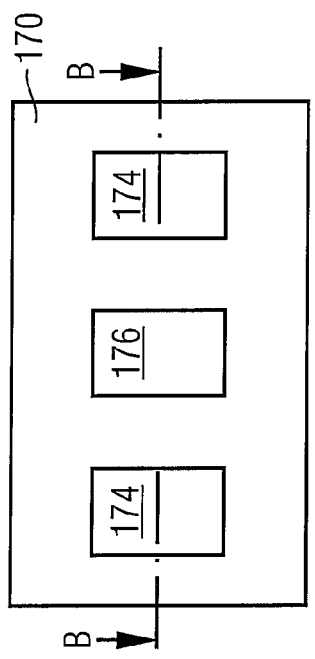
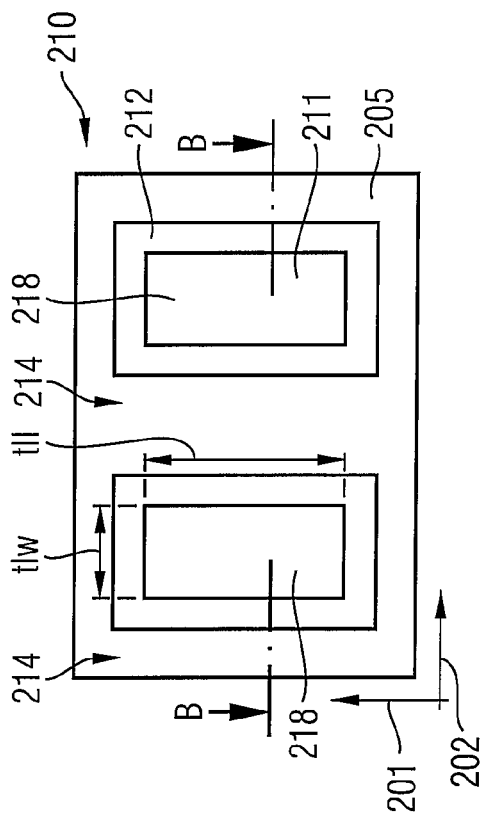

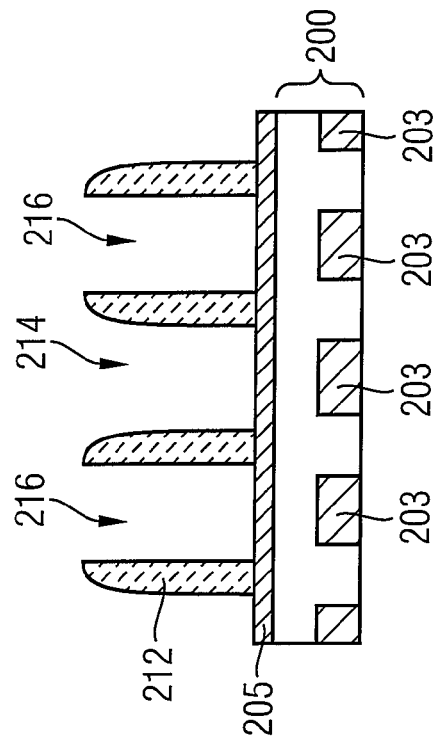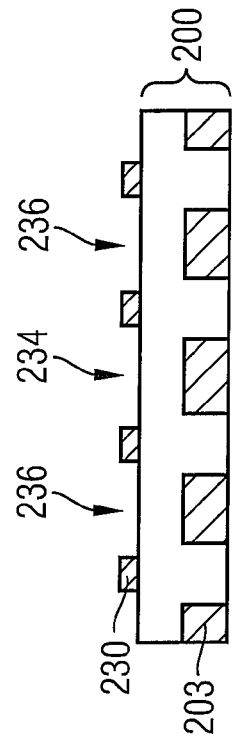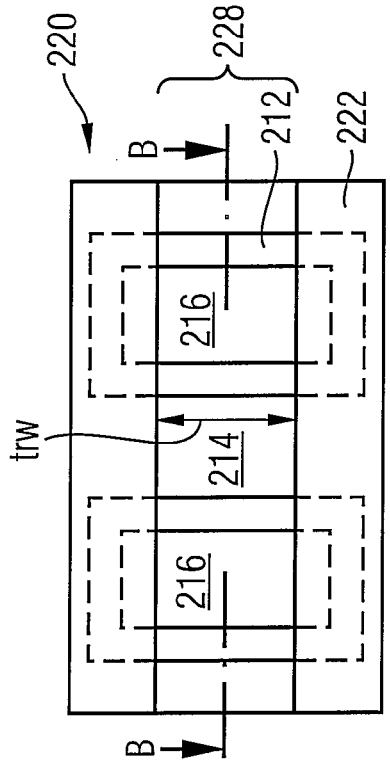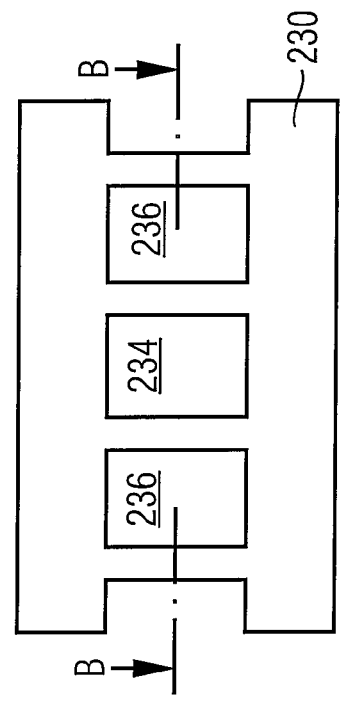

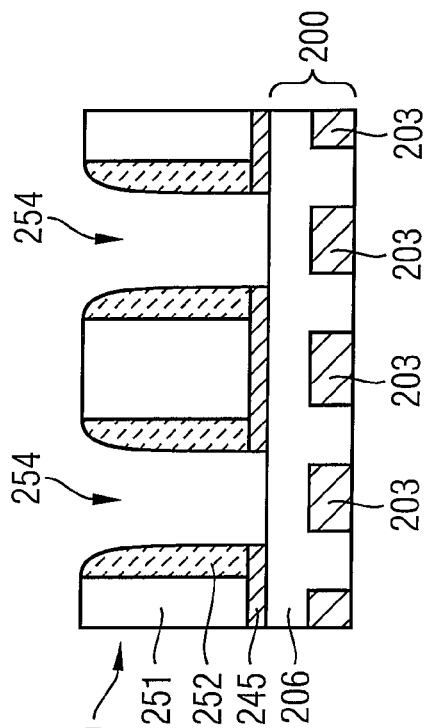
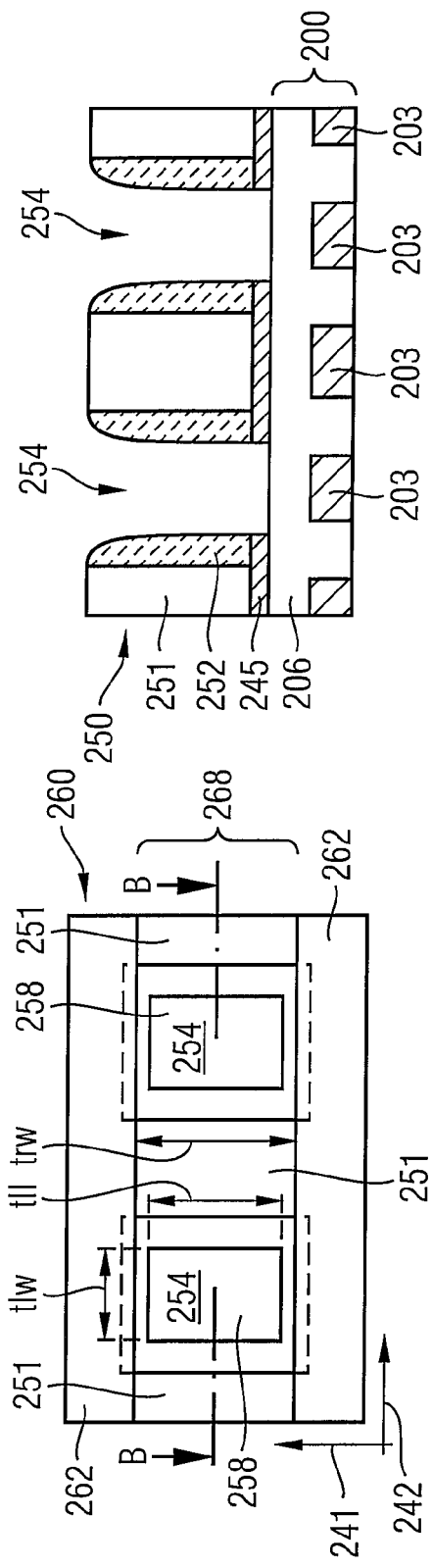
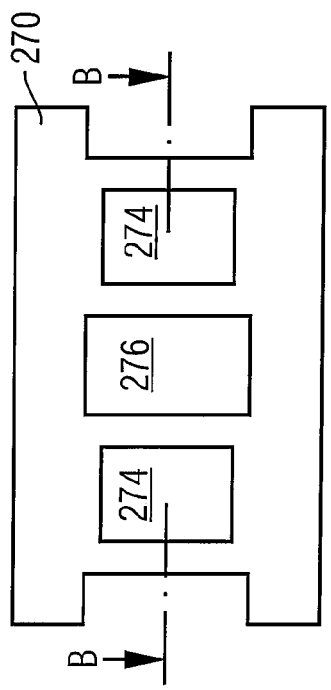

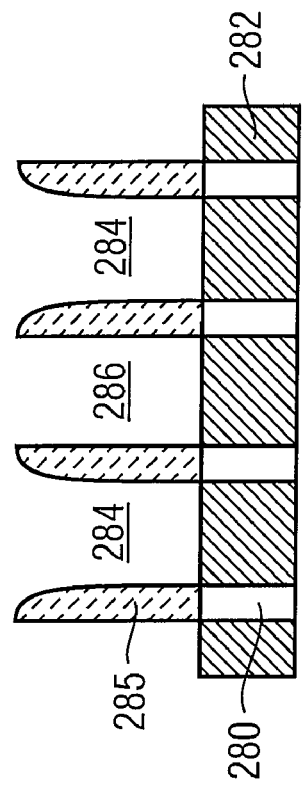
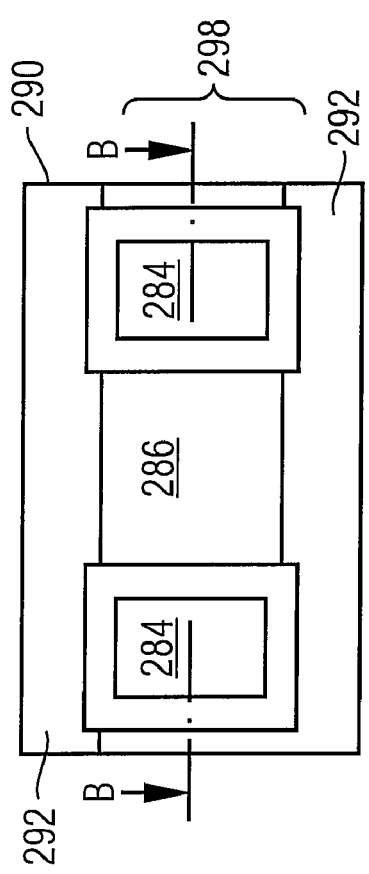
FIG 12B
FIG 12A

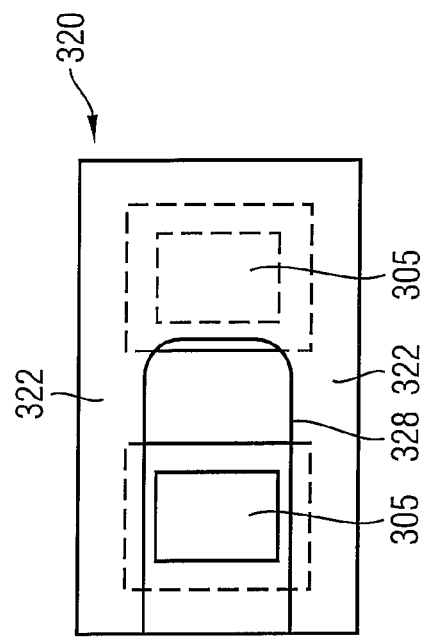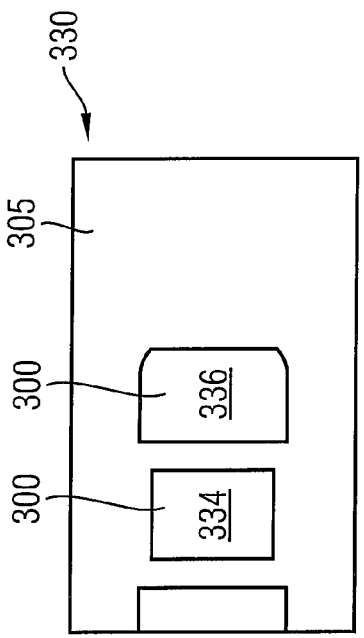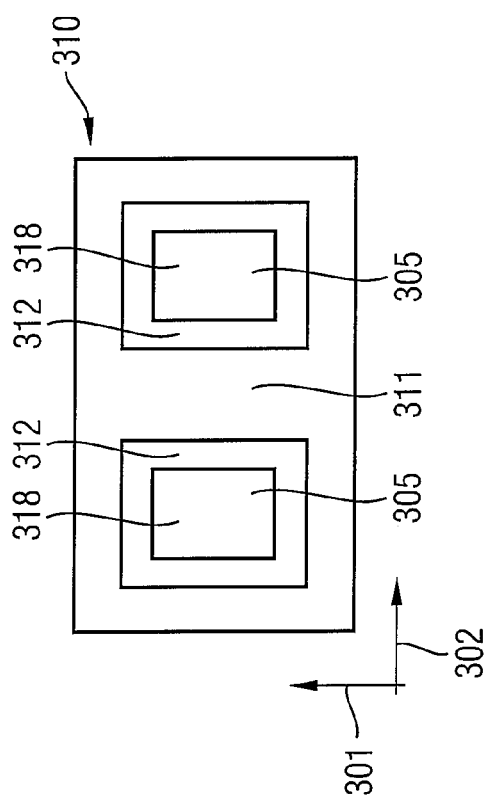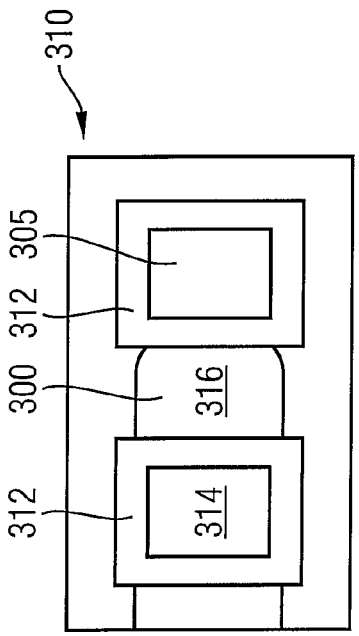

412 411 412 405 412 411 412 405 412 411 412

422 421 422  422 421 422  422 421 422

511 512 518 512 511 512 518 512 511

METHODS OF MANUFACTURING SEMICONDUCTOR STRUCTURES

BACKGROUND

Forming integrated circuits on a semiconductor substrate includes photolithographic patterning processes. The semiconductor substrate is coated with a photoresist material that is sensitive to an exposure radiation. The exposure radiation such as an ultraviolet ray, an electron beam or a X-ray is irradiated onto the photoresist layer for example through a mask or a reticle, wherein the photoresist layer is selectively exposed to the exposure radiation. After exposure, the film is developed to form a photoresist pattern in accordance with or contrary to the mask pattern. The photoresist pattern may be used as an etching mask in the following.

Resolution enhanced techniques (RETs) improve the resolution of optical lithographic systems. For example, evenly spaced parallel line structures may be formed at a pitch that is smaller than a pitch that corresponds to the nominal resolution limit of the lithographic system. In the following, "F" corresponds to a minimum lithographic feature size describing the half pitch of the lines in the densest line field that can be achieved through common RETs. "F" may be in the range of 20 to 140 nanometers. Pitch-fragmentation methods may allow to half the pitch in a dense line field such that, for example, the gate, supply, and data lines of sensor or memory cell arrays may be arranged at a pitch of F.

A need exists for a further shrinkage of the minimum pitch of dot-shaped semiconductor structures, for example buried structures, in two-dimensional arrays and one-dimensional chains of dot-shaped structures.

SUMMARY

A method of manufacturing semiconductor structures is disclosed. In one embodiment, a first mask is provided above a substrate. The first mask includes first mask lines extending along a first axis. A second mask is provided above the first mask. The second mask includes second mask lines extending along a second axis that intersects the first axis. At least one of the first and second masks is formed by a pitch fragmentation method. Structures may be formed in the substrate, wherein the first and the second mask are effective as a combined mask. The structures may be equally spaced at a pitch in the range of a minimum lithographic feature size for repetitive line structures.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A to 1B are a top view and a cross-sectional view of a substrate and a first mask to illustrate a method of manufacturing a contact arrangement according to an embodiment of the invention using a stripe mask as second mask after providing the first mask.

FIGS. 2A to 2B are a top view and a corresponding cross-sectional view of a mask arrangement and of the substrate of FIGS. 1A to 1B after an etch process using a second mask.

FIGS. 4A to 4B are a top view and a corresponding cross-sectional view of a substrate for illustrating a method of manufacturing a contact arrangement according to another embodiment of the invention using a hole mask as the second mask after providing a first mask.

FIGS. 5A to 5B are a top view and a corresponding cross-sectional view of a mask arrangement and of the substrate of FIGS. 4A to 4B after providing a second mask.

FIGS. 6A to 6B are a top view and a corresponding cross-sectional view of the substrate of FIGS. 5A to 5B after forming trenches in the substrate.

FIGS. 7A to 7B are a top view and a corresponding cross-sectional view of a substrate for illustrating a further method of manufacturing a contact arrangement according to a further embodiment using a narrow trim opening after providing the first mask.

FIGS. 8A to 8B are a top view and a corresponding cross-sectional view of a mask arrangement and of the substrate of FIGS. 7A to 7B after providing the second mask and a further etch step.

FIGS. 9A to 9B are a top view and a corresponding cross-sectional view of the substrate of FIGS. 8A to 8B after patterning the substrate.

FIGS. 10A to 10B are a top view and a corresponding cross-sectional view of a mask arrangement and of a substrate for illustrating a method of manufacturing a contact arrangement according to a further embodiment of the invention using a wide stripe-shaped trim opening after providing the second mask.

FIG. 11A to 11B are a top view and a corresponding cross-sectional view of the substrate of FIGS. 10A to 10B after patterning the substrate.

FIGS. 12A to 12B are a top view and a corresponding cross-sectional view of a mask arrangement and of a substrate for illustrating a further method of manufacturing a contact arrangement according to a further embodiment using the first and the second mask as a combined mask without intermediate mask.

FIGS. 13A to 13D are top views of a substrate to illustrate a detail of a method of manufacturing a contact arrangement according to another embodiment of the invention.

DETAILED DESCRIPTION

Figure 3A:
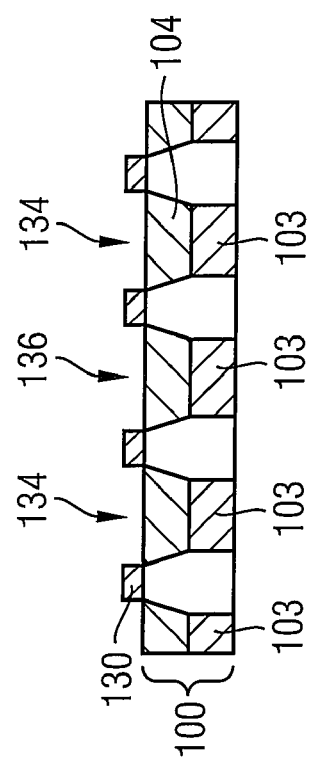
FIGS. 3A to 3C are two top views and a corresponding cross-sectional view of the substrate of FIGS. 2A to 2B after forming the contact arrangement.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

An embodiment of the invention refers to a method of manufacturing semiconductor structures. A first mask is provided above a substrate. The first mask includes first mask lines extending along a first axis. A second mask is provided above the first mask. The second mask includes second mask lines extending along a second axis that intersects the first axis. At least one of the first and second masks is formed by a pitch fragmentation method. Structures are formed in the substrate, wherein the first and the second mask are effective as a combined mask. The structures may be buried structures, for example contacts or impurity regions that are embedded in a mold layer FIGS. 1A to 3C refer to a method of manufacturing semiconductor structures, wherein the semiconductor structures may be buried structures, as for example evenly spaced contacts that are arranged along a contact chain.

Referring to FIG. 1A to 1B, a substrate 100 is provided. The substrate 100 may include a single crystalline semiconductor substrate as for example a silicon wafer, a silicon-on-insulator wafer or a carrier made of, for example, a polymer. The substrate 100 may include other layers that have previously been fabricated and may have been patterned. The substrate 100 may include doped and undoped sections, epitaxial semiconductor layers supported by a base semiconductor or a base insulator as well as other semiconductor and insulator structures. Within the semiconductor substrate 100 a dense field of evenly spaced parallel conductive structures 103 may be formed, wherein the conductive structures 103 extend along a first axis 101. The conductive structures 103 may be buried in an insulating material 106 that may have a planar pattern surface. An intermediate layer 105, for example an amorphous silicon layer, may be deposited on the substrate 100. A sacrificial mask material, for example a silicon oxide, or SiON on Carbon, may be deposited on the intermediate layer 105 or on the substrate 100. Template patterns 118 may be formed in or from the sacrificial mask material by photolithographic techniques.

The template patterns 118 may be template openings 114 that appear to be separated in X-section by line-shaped portions of the sacrificial mask material that appear to form sacrificial lines 111. The sacrificial lines 111 here and in the following may be part of a sacrificial pattern that includes also further portions between the sacrificial lines 111, wherein the further portions confine the template openings 114 along the first axis. A sacrificial line 111 may then be a short bar between neighboring template openings 114, by way of example.

Sidewall spacers may be formed along vertical sidewalls of the sacrificial lines 111. Sections of the sidewall spacers that extend along the first axis form first mask lines 112. Sections of the sidewall spacers that extend along the second axis form transverse mask lines. The sidewall spacers may be formed by conformal deposition of, for example, silicon nitride and a following anisotropic etch during which horizontal sections of the silicon nitride liner are removed. During or after the spacer etch, exposed sections of the intermediate layer 105 may be removed to expose sections of the substrate 100. The thickness of the sidewall spacers may be selected such that a template width tlw along a second axis 102, which may be perpendicular to the first axis 101, is essentially equal to the width of the sacrificial lines 111. According to other exemplary embodiments, the sidewall spacers may be thinner than the sacrificial lines 111 such that the final contact holes or trenches are wider than their half pitch.

As illustrated in FIGS. 2A-2B, a second mask 120, for example a resist mask, is provided above the first mask 110. The second mask 120 may have a trim opening 128 extending along the second axis 102 and having a width trw along the first axis 101 that is essentially equal to a template length tll of the template patterns 118 along the first axis 101. According to FIG. 2A, the trim opening 128 exposes at least a section of the sacrificial lines 111 between neighboring template patterns 118. The exposed sections of the sacrificial lines 111 are removed, wherein the second mask 120 is effective as an etch mask and the sidewall spacers remain essentially.

According to FIG. 2B, within an area defined by the trim opening 128, the first mask 110 includes first mask lines 112 resulting from the sidewall spacers, first openings 114 corresponding to the template patterns 118 and second openings 116 resulting from the etch using the second mask 120. Thus, the first mask 110 results from a line-by-space pitch fragmentation method. The lithographic requirements for the formation of the template patterns 118 are relaxed, as the pitch of the template patterns 118 may be four times the minimum feature size F. Exposed sections of the intermediate layer 105 may be removed by etching, wherein the sidewall spacers and the resist mask 120 act as a combined etch mask.

Figure 3B:
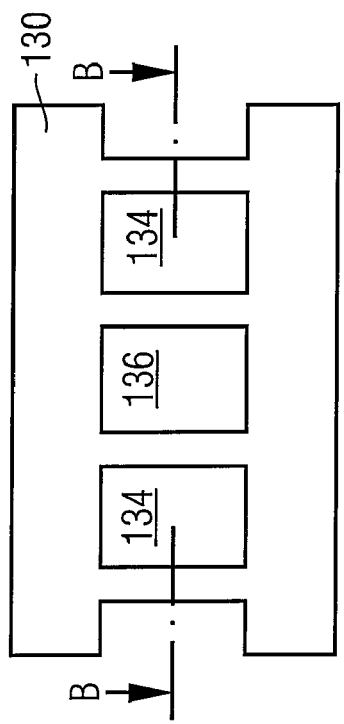
Figure 3C:
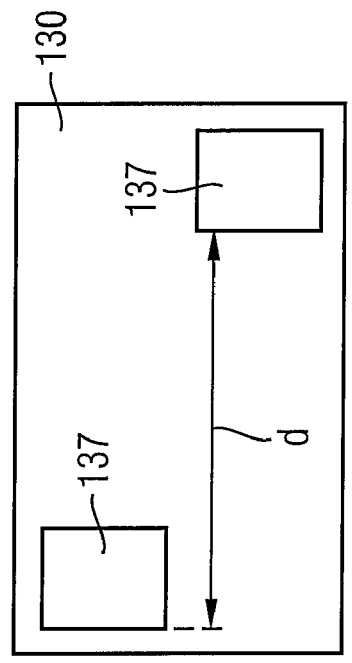

Referring to FIG. 3A to 3C, remanent sections of the second mask 120, the sacrificial mask material and the first mask lines 112 may be used to etch an intermediate mask 130 formed from the intermediate layer 105. The combined pattern of the first mask 110 and the second mask 120 is transferred into the intermediate layer 105 to form the intermediate mask 130. Using the intermediate mask 130 as an etch mask, trenches, for example contact holes, may be formed in the insulating material 106 to expose the buried conductive structures 103. Conductive material may be filled in the trenches to form buried structures 104, wherein each buried structure 104 is in contact with one of the buried conductive structures 103.

According to FIG. 3C, in a second section of the substrate 100, the intermediate mask 130 may include further openings 137, 138 at a pitch of more than 2 F. The further openings 137, 138 may be printed using another section of the first mask 110 in order to facilitate a simple process integration of, for example, dense contact chains and isolated contacts, wherein an isolated contact has a distance to the next contact that is larger than 6 F, e.g., 1000 nm. The isolated contacts are processed according to the template patterns 118, wherein after forming further template openings in the sacrificial mask material contemporaneously with the first openings 114, sidewall spacers may be provided that line the further openings 137, 138. The intermediate layer 105 may be etched contemporaneously in the first and the second substrate section. During processing of the trim openings, the second mask 120 may cover the second section.

According to FIGS. 3A and 3B, the buried structures 104 are arranged to form a contact chain having evenly spaced contacts of essentially the same shape, the same contact length along the first axis 101 and the same contact width along the second axis 102. The trim opening 128 does not trim the first mask lines 112 but the sacrificial mask lines 111 between them. The distance of the contacts is well defined by the width of the first mask lines 112. The length of the contacts may be defined by the trim width trw of the trim opening 128, if the template length tll exceeds the sum of the trim width trw and the maximum permissible mask displacement. The length of one half of the contacts may be defined by the template length tll, if the edges of the trim opening are adjusted to the width of the transverse mask lines and if the maximum permissible mask displacement is smaller than the half of the thickness of the transverse mask lines. The method may be applicable for contacts at densest pitch.

The sacrificial mask material, the sidewall spacer material and the material of the underlayer are selected such that they may be etched selectively against each other. A first material is etched selectively against a second material if they are etched at different etch rates, when they are exposed to the same etch chemistry. The sacrificial mask material may be amorphous silicon, silicon oxide or silicon nitride, the spacer material silicon nitride or silicon oxide and the underlayer material silicon oxynitride or amorphous silicon, by way of example.

FIG. 4A to 6B refer to a further method of forming a contact arrangement having a dense contact chain, which may be applicable for relaxed pitch requirements.

FIGS. 4A and 4B illustrate a first mask 150 provided above a substrate 140. Within the substrate 140, buried lines 143 may extend along a first axis 141. The buried lines 143 may be buried in an insulator material 146 and may be evenly spaced at a dense pitch as illustrated, and relaxed at other parts of the layout. The dense pitch of the buried lines 143 can be provided by pitch fragmentation. The lines may be e.g., gate conductor lines, or active area lines or metal lines. An intermediate layer 145 may be provided on the substrate 140. A sacrificial material may be deposited above the substrate 140, for example on the interlayer 145. By photolithographic techniques, template patterns 158 may be provided. The template patterns 158 may be template openings 154, wherein between neighboring template openings 154 sacrificial mask lines 151 result from the sacrificial material. The sacrificial material may be a silicon oxide, by way of example. A conformal liner, for example a silicon nitride liner, may be deposited and etched anisotropically, such that horizontal sections of the conformal liner are removed to expose sections of the intermediate layer 145 between neighboring sacrificial lines 151. The uncovered sections of the intermediate layer 145 may be removed.

FIG. 4A illustrates template patterns 158 having a template length tll along the first axis 141 and a template width tlw along a second axis 142. The template patterns 158 are arranged at a pitch that is at least twice the minimum pitch 2 F. Sections of the sidewall spacers that extend along the first axis 141 form first mask lines 152.

Referring to FIG. 5A to 5B, a second mask material, for example a resist material may fill the template openings 154 and cover the first sacrificial lines 151. By photolithographic techniques, contact openings 164, which, in some respect, may be effective equivalent to a patterned trim opening in the meaning described above, are formed in the resist material to provide a second mask 160. Sections of the resist material form dark edges 162, which are effective as short second mask lines in the meaning as described above, extending along the second axis 142. A distance between neighboring second dark edges 162 defines a contact length trw of the second openings 164 along the first axis 141, wherein the contact length corresponds to the trim width trw as described above. According to FIG. 5B, each contact opening 164 exposes a section of one of the sacrificial lines 151 between neighboring template openings 154. The contact openings 164 may be combined with a trim opening, as discussed for example with regard to FIG. 3, in the same mask in order to print dense, semi-dense and isolated contacts contemporaneously.

Referring to FIG. 6A to 6B, exposed sections of the sacrificial lines 151 may be etched to expose further sections of the intermediate layer 145. The exposed sections of the intermediate layer 145 may be removed. Remanent portions of the second mask 160, the sacrificial lines 151 and the first mask lines 152 may be removed to expose the remaining sections of the intermediate layer 145 that forms an intermediate mask 170. The intermediate mask 170 includes first openings 174 resulting from the template openings 158 and second openings 176 corresponding to the contact openings 164 in the second mask 160.

A first dimension trl of the contact openings 164 along the second axis 142 and a second dimension, which corresponds to a trim width trw in the meaning as discussed above and which extends along the first axis 141, may be selected to be essentially equal to the template width tlw and template length tll respectively. The distance between the second openings 176 and the neighboring first openings 174 may differ due to an overlay tolerance between the first 150 and the second mask 160. Even at a large overlay displacement, the first and the second openings 174, 176 will remain separated by the first mask lines 112 as the etch of the sacrificial lines 151 is selective to the material of the first mask lines 152. In this way, the formation of semi-dense contacts may be simplified or may be easily combined with the formation of dense contacts.

As illustrated in FIG. 6B, trenches 144 may be formed that expose the conductive structures 143. A conductive material may fill the trenches 144 to form a contact in each trench 144.

The dimensions of the second openings 176 are defined by the second mask solely. In order to adjust their size to that of the first openings 174 and to achieve the same dimensions for the first and the second openings 174, 176, the contact openings 164 may be formed using another etch chemistry as used for the template openings 154. According to another embodiment, the contact openings 164 may be printed larger than required and then narrowed by a suitable process step, for example by a reflow step or a relax step, to match their dimensions to those of the template openings 154. Alternatively the contact openings 164 can have a larger target than the template openings 154. According to another embodiment, the trim patterning regarding the contact openings 164 may be applied after a removal of the sacrificial lines 151 or even after etching the intermediate layer 145. In a further alternative, the contact openings 164 may be printed and etched before the formation of the sidewall spacers such that the sidewalls spacers are fabricated both on the edges of the template openings 154 and the contact openings 164 in the same step. Further, together with the contact openings 164, other patterns may be printed, too, as well as, together with the template openings 154, other patterns may be printed, too.

FIGS. 7A and 7B refer to a further embodiment of a method of manufacturing a contact arrangement that includes a contact chain with evenly spaced contacts. According to FIG. 7B, a substrate 200 may be provided that may include buried conductive structures 203. The buried conductive structures 203 may be embedded in an insulator material 206. An intermediate layer 205 may be disposed on a plane pattern surface of the substrate 200. The buried lines 203 may be spaced at a pitch equivalent to 2 F and may extend along a first axis 201.

A first mask 210 is provided above the substrate 200. For this purpose, a sacrificial material may be deposited on the patterned surface substrate 200 or on the intermediate layer 205. Using a photolithographic technique, template patterns 218 may be formed from the sacrificial material. The template patterns 218 may be template mesas covering sections of the intermediate layer 205 or the substrate 200. The template patterns 218 may have a template length tll along the first axis 201 and a template width tlw along a second axis 202, which is perpendicular to the first axis 201. The shape of the template mesas may be rectangular with rounded corners, stripe-shaped, circular, elliptic or oval. Sidewall spacers are provided on vertical sidewalls of the template mesas.

FIGS. 7A and 7B illustrate the template patterns 218, wherein the center to center distance between neighboring template mesas 218 may be four times the minimum feature size F. Sections of the sidewall spacers extending along the first axis 201 form first mask lines 212. A first opening 214 exposes the intermediate layer 205 between neighboring template mesas. The template mesas have a template length tll along the first axis 201 and a template width tlw along the second axis 202. The sacrificial lines 211 form a first mask 210, wherein the first mask 210 results from the described pitch fragmentation method.

As illustrated in FIGS. 8A and 8B, a second mask 220 is provided above the first mask 210. The second mask 220 may be formed by depositing a mask material, for example a resist material, that fills the spaces between the template mesas 218 and that covers the template mesas 218. Using a photolithographic mask, the second mask 220 is formed from the resist material, wherein the second mask 220 includes a trim opening 228 extending along the second axis 202 above the template mesas. The trim opening 228 has a trim width trw along the first axis 201 which is smaller than the template length tll. The trim opening 228 exposes a central section of the template mesas and sections of the intermediate layer 205 between neighboring template mesas, respectively. Exposed sections of the template mesas are removed selectively against the first mask lines 212. Using the first mask lines 212 and the second mask lines 222 as combined etch mask, exposed sections of the interlayer 205 are removed to form an intermediate mask 230 from the intermediate layer 205. The intermediate mask 230 includes first openings 234 resulting from the first openings 214 and second openings 236 resulting from the template mesas.

FIG. 9A illustrates the intermediate mask 230. Using the intermediate mask 230 as etch mask, trenches may be formed in the substrate 200 to expose the conductive structures 203. The trenches may be filled with a conductive material to form a contact, respectively. The contacts may be formed along a row and have essentially the same contact width along the second axis and the same contact length along the first axis. The distance between the contacts is defined by the thickness of the sidewall spacers forming the first mask lines 212. The trim opening 228 does not trim the first mask lines (sidewall spacers) 212, which emerge from the described pitch fragmentation method, but the template mesas and lines of the intermediate layer 205 between them.

FIGS. 10A to 11B refer to an embodiment regarding to a further method of manufacturing a contact arrangement having a contact chain with contacts that are spaced at a sublithographic pitch, wherein, in the following, a sublithographic pitch is understood as a pitch at which contacts may be manufactured with an insufficient process window in the conventional way. According to an embodiment, the contacts are evenly spaced. An intermediate layer 245 is provided on a pattern surface of a substrate 240. A sacrificial material is deposited on the intermediate layer 245. Via a photolithographic patterning method, first openings 245 are formed in the layer of the sacrificial material. First openings 254 are arranged along a second axis 242. Sidewall spacers are formed along the vertical sidewalls of the first openings 254, wherein sections of the sidewall spacers that extend along a first axis 241 that is perpendicular to the second axis 242, form first mask lines 252. The first mask lines 252 form a first mask 250. Above the first mask 250, a second mask 260 may be provided by depositing a resist layer and patterning the resist layer by photolithographic techniques. The second mask 260 includes a trim opening 268 extending along the second axis 242 above the first openings 254 and second mask lines 262 confining the trim opening 268. The trim opening 268 has a trim width trw along the first axis 241. The first openings 254 confined by the sidewall spacers form template openings 258 with a template length tll along the first axis 241 and a template width tlw along the second axis 242. The edges of the trim opening 268 run above sections of the sidewall spacers that form transverse mask lines extending parallel to the second axis 242.

By etching sections of the sacrificial lines 251 exposed by the trim opening 268, corresponding sections of the intermediate layer 245 are exposed. The combined pattern of the first and second mask lines 252, 260 is transferred into the intermediate layer 245. Remaining portions of the second mask 260, the sacrificial lines 251 and the first mask lines 252 are removed to provide an intermediate mask 270 as illustrated in FIGS. 11A to 11B. Using the intermediate mask 270 as etch mask, trenches 244 may be formed to expose the conductive structures 243.

The intermediate mask 270 includes first openings 274 resulting from the template openings 258 and second openings 276 resulting from sections of the sacrificial lines 251 that are exposed by the trim opening 268. The length along the first axis 241 of contacts resulting from the first openings 274 is defined by the template length tll, while the length of contacts resulting from the second openings 276 is defined by the trim width trw. If the edges of the trim opening 268 are adjusted to the centre of the transverse mask lines and if the maximum permissible mask displacement is smaller than one half the thickness of the transverse mask lines, the length of the contacts results from the template length tll and depends from one single lithographic step only.

FIGS. 12A and 12B refer to a further embodiment corresponding to the method as illustrated in FIGS. 10A to 11B, wherein the substrate 280 is etched without intermediate mask. First mask lines 285 corresponding to the first mask lines 252 of FIG. 10B and second mask lines 292 corresponding to second mask lines 262 are used as a combined etch mask to form trenches in the substrate 280. The combined etch mask includes first openings 284 resulting from a pattern process of a first mask and second openings 286 resulting from a second etch using the second mask 290.

FIGS. 13A to 13D refer to an embodiment that may correspond to a method of manufacturing the contact arrangement having dense contact chains as illustrated in FIGS. 10A to 11B. Referring to FIG. 13A, an intermediate layer 305 is deposited on a pattern surface of the substrate 300. A sacrificial material is deposited on the intermediate layer 305. Evenly spaced openings are formed in the sacrificial material at a pitch that may be four times the minimum pitch 2 F. Sidewall spacers are provided along the vertical sidewalls of the openings and surround template openings 318. Sections of the sidewall spacers extending along a first axis 301 form first mask lines 312. Neighboring template patterns 318 are separated by sacrificial lines 311 provided from sections of the sacrificial material.

Second mask lines 322 may be provided as illustrated in FIG. 13B. A trim opening 328 of the second mask 320 may expose a section of the sacrificial lines 311, wherein one of the neighboring template patterns 318 may remain covered. The edge of the opening 328 along the first axis 301 may be provided above the first mask line 312 confining the contact chain.

According to FIG. 13C, the first mask lines 312 and the second mask lines 322 are used as a combined etch mask to remove exposed sections of the sacrificial lines 311. Exposed sections of the intermediate layer 305 are removed to provide an intermediate mask 330 as illustrated in FIG. 13D.

The intermediate mask 330 includes first openings 334 and second openings 336, wherein the end of the contact chain is well defined and wherein along the second axis 302 an overlay tolerance between the first and the second mask in the range of the thickness of the sidewall spacers is permissible.

FIG. 14A to 14D refer to an embodiment of a method of manufacturing a contact arrangement having a dense contact chain, wherein a difference between the length of first contacts resulting from a first mask and second contacts resulting from a second mask may be minimized.

Figure 14A:
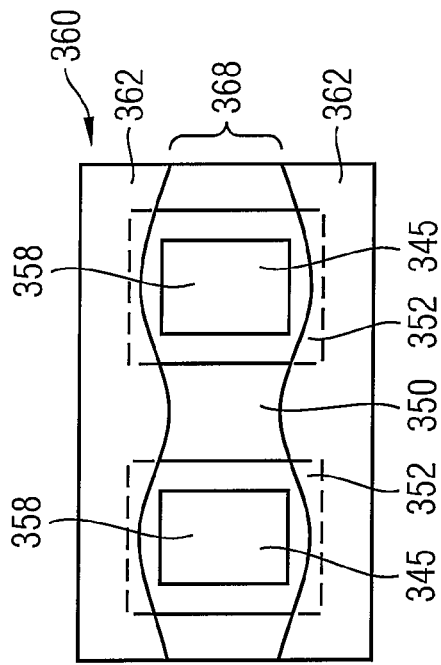
FIGS. 14A to 14B are top views of a substrate to illustrate a method of manufacturing a contact arrangement using an undulated trim opening according to a further embodiment of the invention.

According to FIG. 14A, an intermediate layer 345 is disposed on a substrate 340. A layer of a sacrificial material is disposed on the intermediate Layer 345. First openings are formed in the sacrificial material that expose the intermediate layer 345. Along vertical sidewalls of the openings, sidewall spacers are formed that narrow the openings to template openings 358. The openings are arranged along a chain axis 342. Sections of the sidewall spacers extending along a first axis 341 that is perpendicular to the chain axis 342 form first mask lines 352 of a first mask. Sections of the sacrificial material between neighboring template openings 358 form sacrificial lines 351.

Figure 14B:
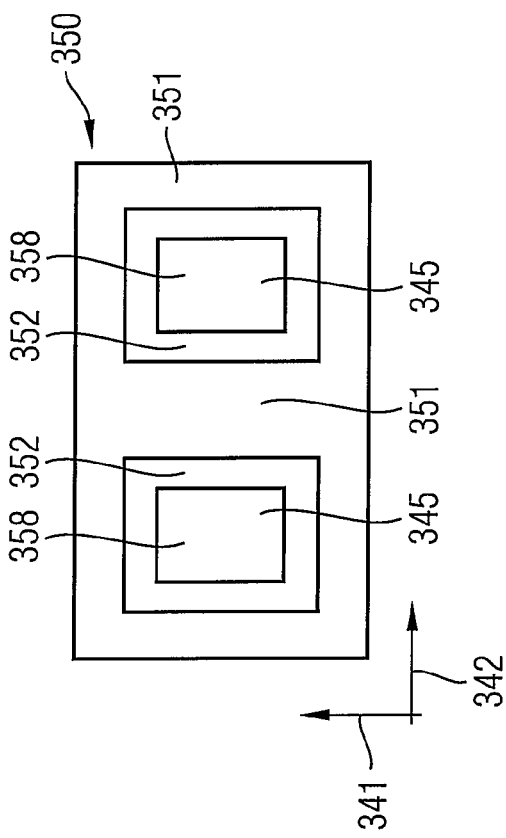

As illustrated in FIG. 14B, a second mask 360 is provided above the first mask lines 352. The second mask 360 includes second mask lines 362 extending along a chain axis 342 and a trim opening 368 extending between the second mask lines 362 above the template openings 358, wherein sections of the sacrificial lines 351 between neighboring template openings 358 are exposed. The edges of the trim opening 368 are bowed and undulated, such that the trim opening 368 may have a maximum trim width along the first axis 341 above the template openings and a minimum trim width between neighboring template openings 358. Further, the edges of the trim openings 368 run in sections above sections of sidewall spacers extending along the chain direction 342. In this way, the widths and lengths of first contacts resulting from the template openings 358 may be determined in a simple way by the first patterning only, and are not modified by the second patterning. Further, the lengths of second contacts resulting from etching sections of the sacrificial lines 351 exposed by the trim opening 368 may easily be fitted to the length of the first contacts.

Figure 14C:
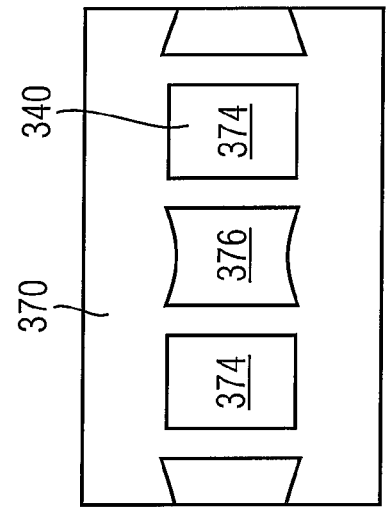

As illustrated in FIG. 14C, sections of the sacrificial lines 351 exposed by the trim opening 368 are removed to expose further sections of the intermediate layer 345.

Figure 14D:
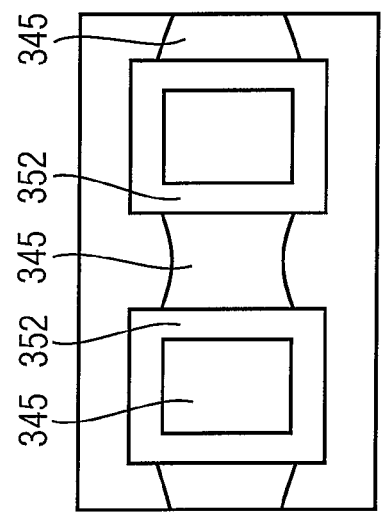

According to FIG. 14D, remanent sections of the second mask 360, the sacrificial lines 351 and the first mask lines 352 may be removed to expose the intermediate mask 370. The intermediate mask 370 comprises first openings 374 resulting from the template openings 358 and second openings 376 resulting from etching sections of the sacrificial lines 351 exposed by the trim opening 368.

With regard to FIG. 11A-11B, the insulated trim opening 360 may support the formation of contact chains having contacts of nearly the same contact area. If the maximum permissible mask displacement is in the range of the half of the sidewall spacer thickness, the length of the contacts resulting from etching the sacrificial lines is adapted to the length of the contacts resulting from the template opening. Finally the contacts will become rounded on wafer such that the corners of the patterns with smaller equal 90 degree angles get a convex shape.

Figure 15A:
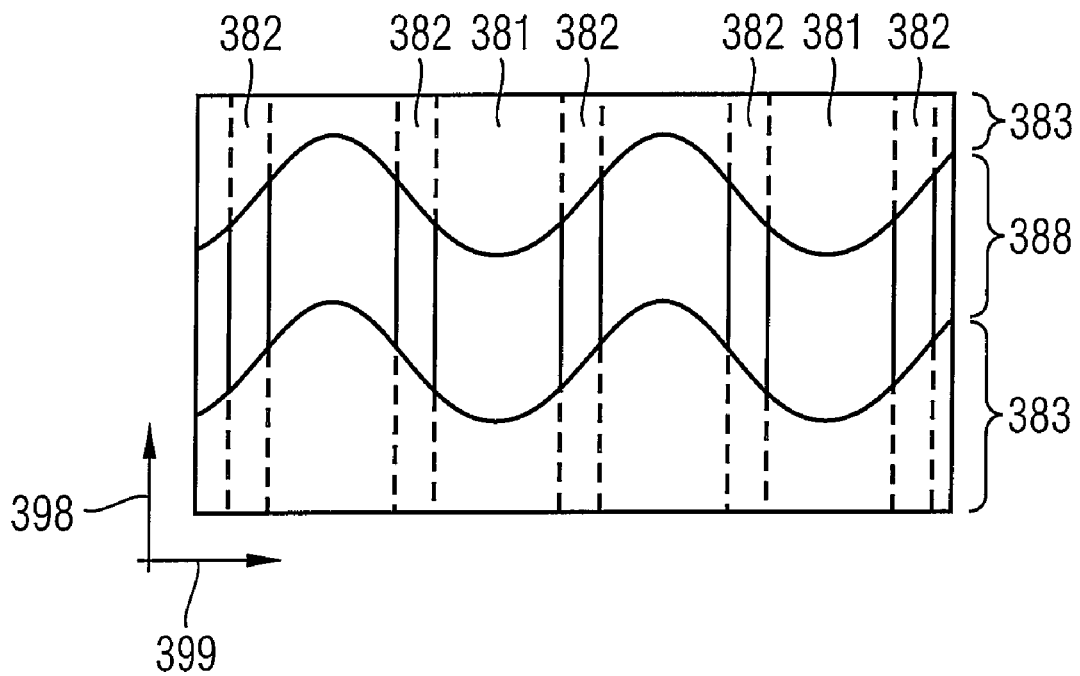
FIGS. 15A to 15B are top views of a substrate for illustrating a method of forming a contact arrangement with staggered rows of contacts according to a further embodiment of the invention.
Figure 15B:
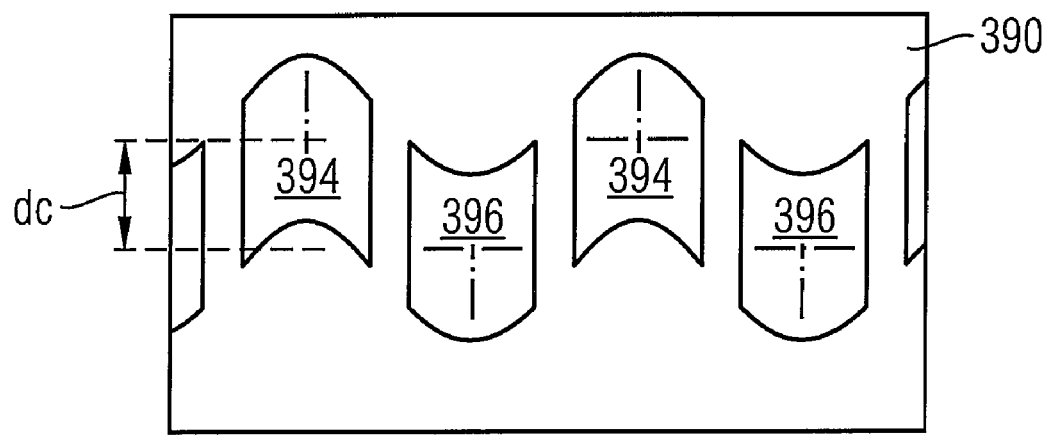

FIG. 15A to 15B refer to a further method of manufacturing a contact arrangement with dense contact chains. A first mask having first mask lines 382 extending along a first axis 398 may be provided by a pitch-fragmentation method using sacrificial lines 381. A second mask that may be disposed above the first mask may include second mask lines 381 extending essentially along a second axis 399 which is perpendicular to the first axis 398. The second mask further comprises a trim opening 388 between neighboring second mask lines 383. The trim opening 388 is undulated. The edges are periodically curved with a period of twice the minimum pitch 2 F, wherein the distance between the edges of the trim width 388 along the first axis 398 is essentially constant. Using the first and second mask lines 382, 383 as combined etch mask, first and second openings 394, 396 may be formed in a substrate as illustrated in FIG. 15B.

A contact chain having first contacts arranged along a first row and second contacts arranged along a second row may be provided in this way. The arrangement in two staggered rows may relax the overlay requirements regarding a further lithographic mask for patterning buried line structures connecting the first and second contacts.

FIGS. 16A to 22B illustrate a method of manufacturing buried structures according to a further embodiment. The buried structures may be doped regions, contacts, insulator structures or complex structures, the formation of which comprises a trench formation, for example trench capacitors or trench-in-oxide capacitors.

As illustrated in FIG. 16, a substrate 400 may be provided. The substrate 400 may be a semiconductor substrate, for example a single crystalline silicon wafer, which may include doped and undoped sections, epitaxial semiconductor layers supported by a semiconductor or a base insulator as well as other semiconductor insulator structures. An intermediate layer 405 may be disposed on a pattern surface of the substrate 400. The intermediate layer 405 may be for example a silicon oxide layer with a thickness of 10 to 100 nm. A first mask may be provided above the substrate 400 by a pitch fragmentation method. According to the present embodiment, the pitch fragmentation method is a line-by-spacer method, wherein a sacrificial material is deposited and patterned by a line/spacer mask to form evenly spaced sacrificial lines 411 running along a first axis 401 and being spaced from each other at a minimum pitch of 2 F. A spacer material is deposited that covers exposed sections of the intermediate layer 405 and the sacrificial lines 411 in conformal thickness. The thickness of the spacer layer may be about 0,5×F. The spacer layer is anisotropically etched, wherein horizontal sections of the spacer layer are removed.

Figure 16A:
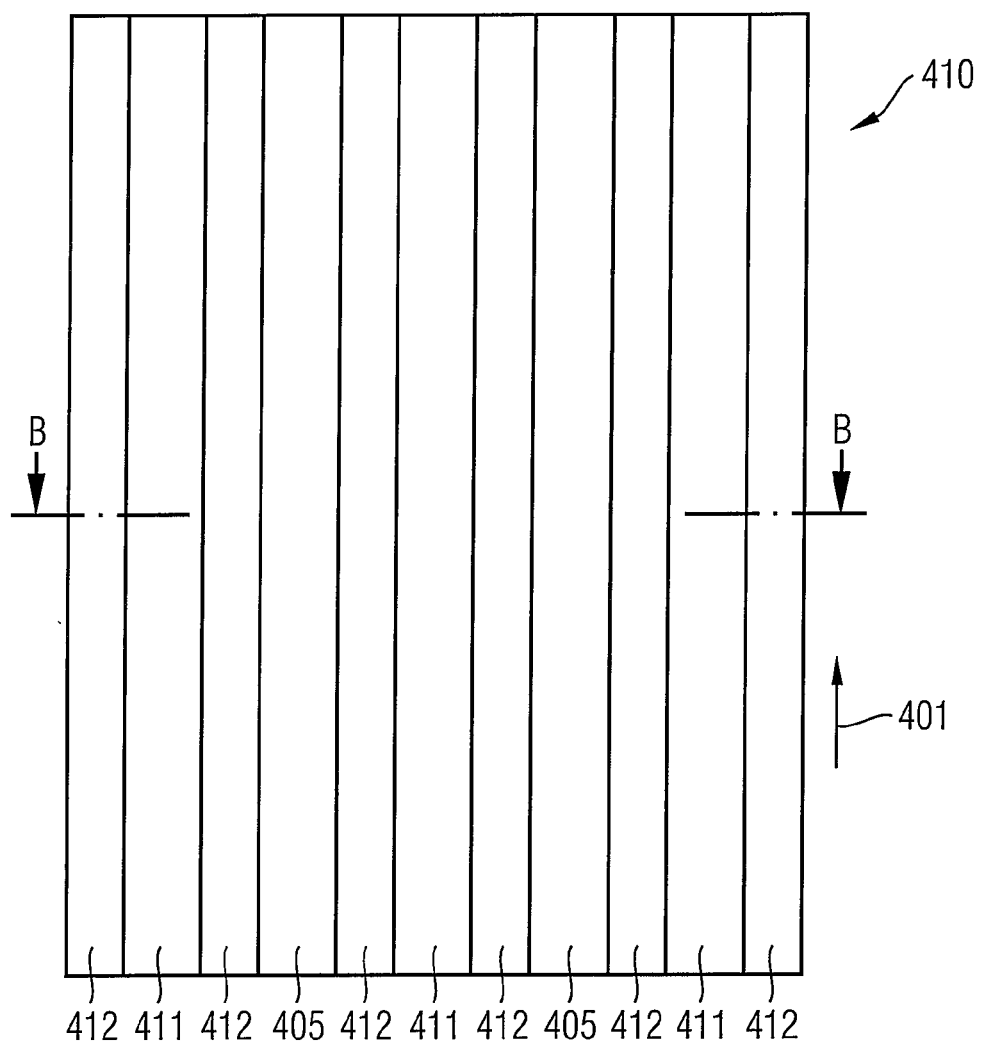
FIGS. 16A to 16B are a top view and a corresponding cross-sectional view of a substrate for illustrating a method of manufacturing buried structures according to another embodiment of the invention after providing a first mask by pitch-fragmentation.
Figure 16B:
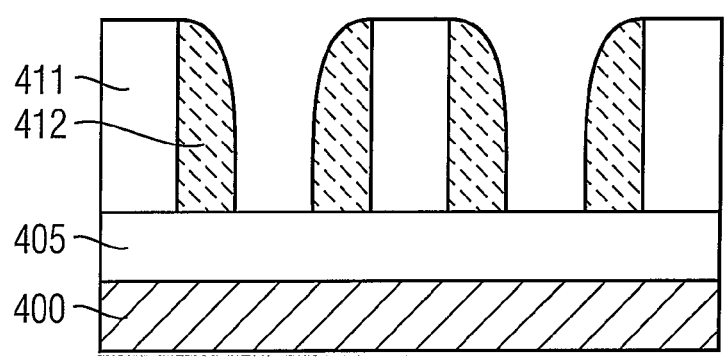

FIG. 16B illustrates first mask lines 412 resulting from the spacer layer via the spacer etch. The first mask lines 412 extend along the first axis 401 above the substrate 400. The material of the sacrificial lines 411 may be, for example, a silicon oxide, silicon nitride, amorphous silicon or polysilicon. The material of the first mask lines 412 may be a second material that is selected such that a high etch selectivity between the first material and the second material may be achieved. The second material may be a silicon oxide, silicon nitride, amorphous silicon or polysilicon.

Figure 17A:
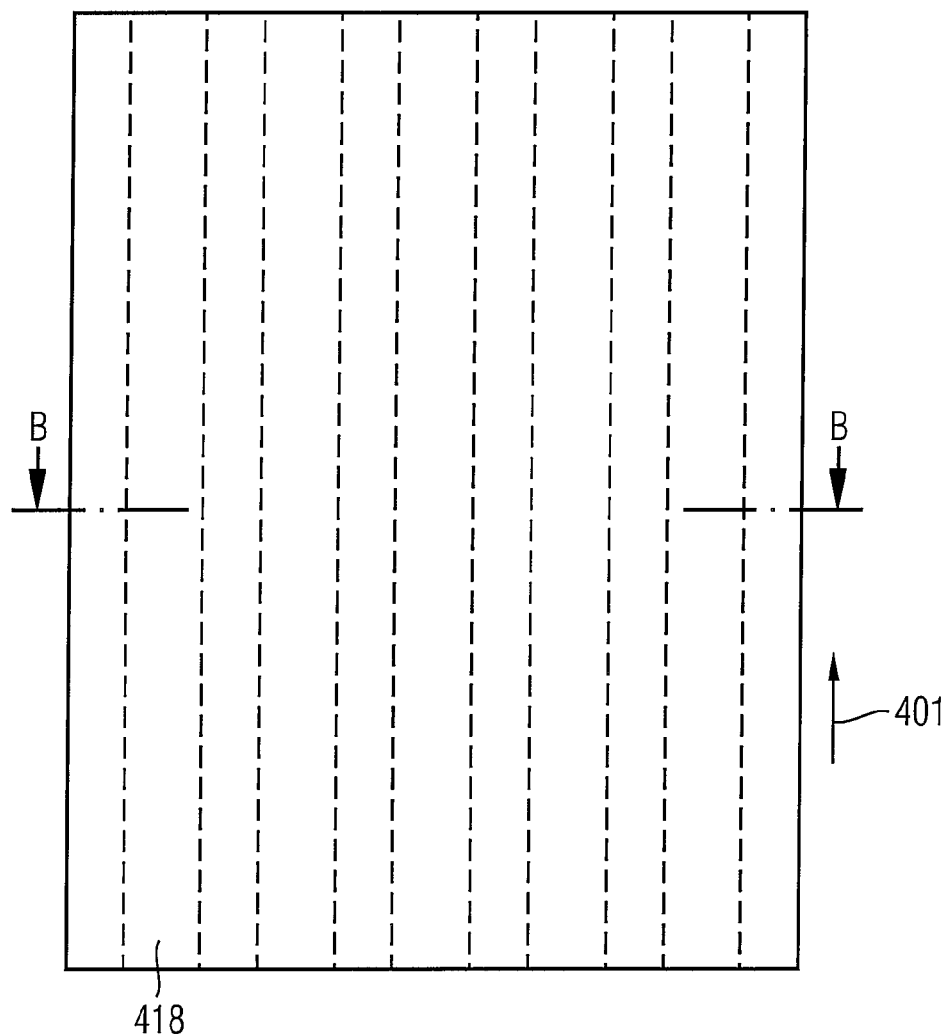
FIGS. 17A to 17B are a top view and a corresponding cross-sectional view of the substrate of FIGS. 16A to 16B after filling the first mask.
Figure 17B:
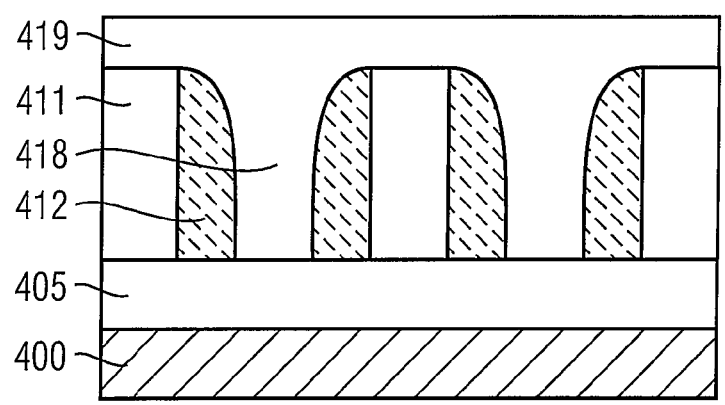

According to FIGS. 17A and 17B a fill material is deposited. The fill material is, for example, the same as the first material or another material which illustrates a high etch selectivity against the second material of the first mask lines 412. The fill material forms at least a first mask fill 418, that fills the spaces between the first mask lines 412. A section of the fill material may cover the first sacrificial lines 411 and the first mask lines 412 as a first mask overfill 419.

Figure 18A:
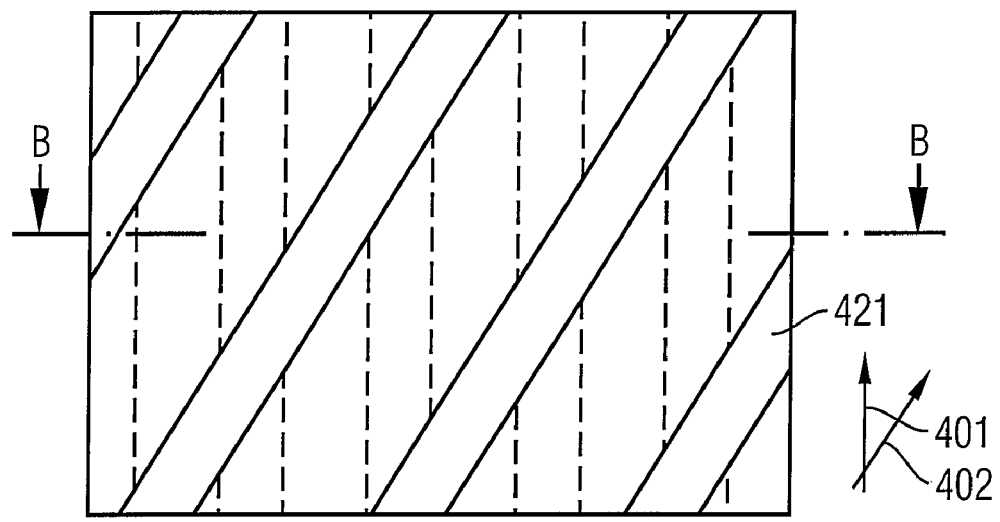
FIGS. 18A to 18B are a top view and a corresponding cross-sectional view of the substrate of FIGS. 17A to 17B after providing template lines of a second mask.
Figure 18B:
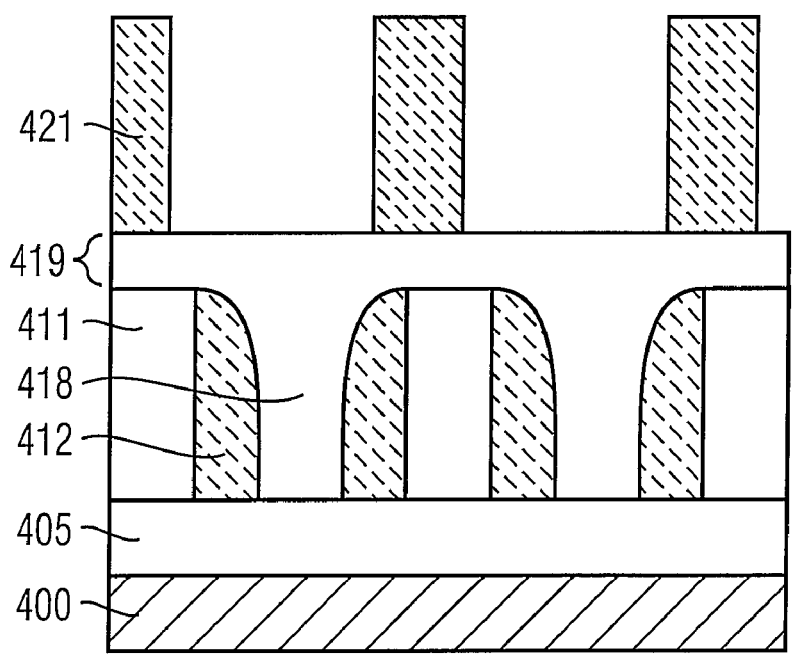

As illustrated in FIGS. 18A to 18B, a second mask is provided above the first mask lines 412. For this purpose, a plurality of template lines 421 may be provided above the first mask overfill 419. The template lines 421 extend along a second axis 402 that intersects the first axis 401. An angle between the first and second axis 401, 402 may be between 35° and 65°, for example 32°. The pitch of the template lines 421 may be, for example, twice the minimum pitch 2 F. The width of the template lines may be for example F. A material of the template lines 421 may be a third material which illustrates a high etch selectivity against the first material of the sacrificial lines 411, the fill material of the first mask fill 418, and the first mask overfill 419. In an exemplary embodiment, the third material may be the same as the first material forming the first mask lines 412.

Figure 19A:
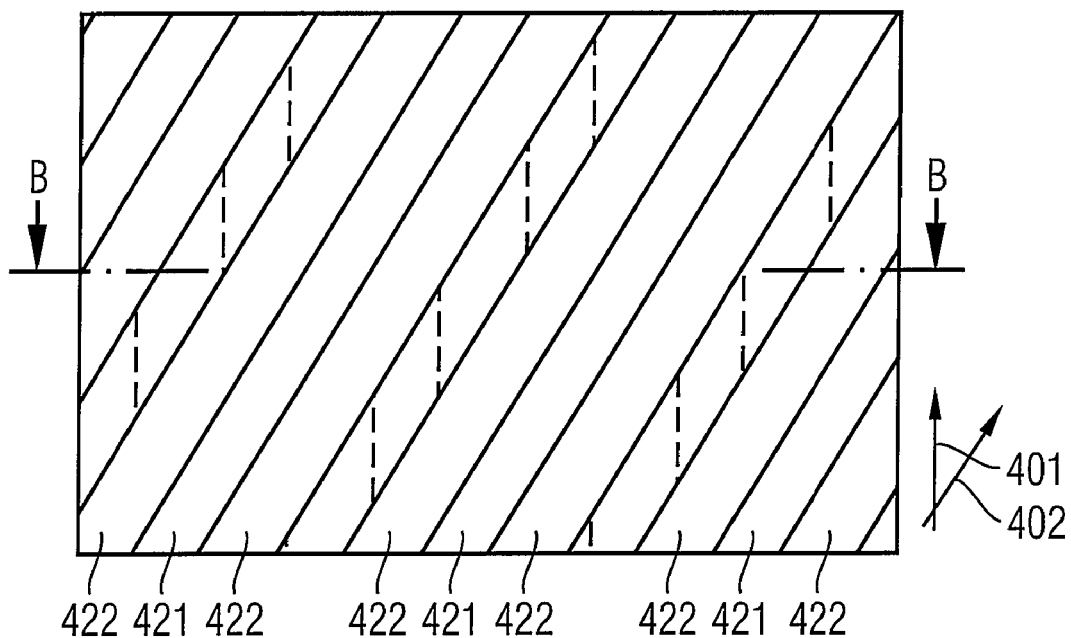
FIGS. 19A to 19B are a top view and a corresponding cross-sectional view of the substrate of FIG. 18A to 18B after forming sacrificial sidewall spacers.
Figure 19B:
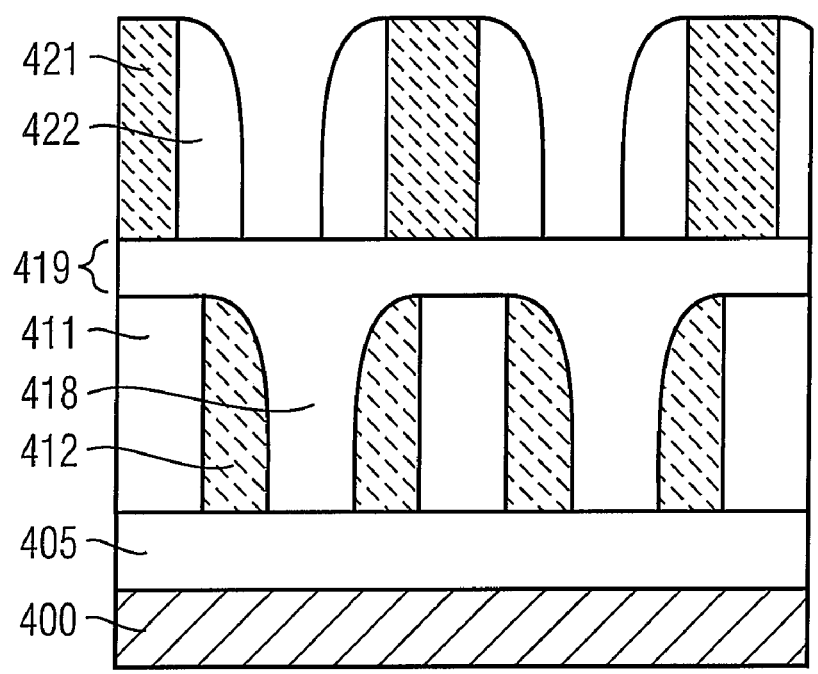

According to FIG. 19A, sacrificial spacers 422 may be formed on vertical sidewalls of the template lines 421 in a similar way as explained with regard to the formation of the first mask lines 412.

Figure 20A:
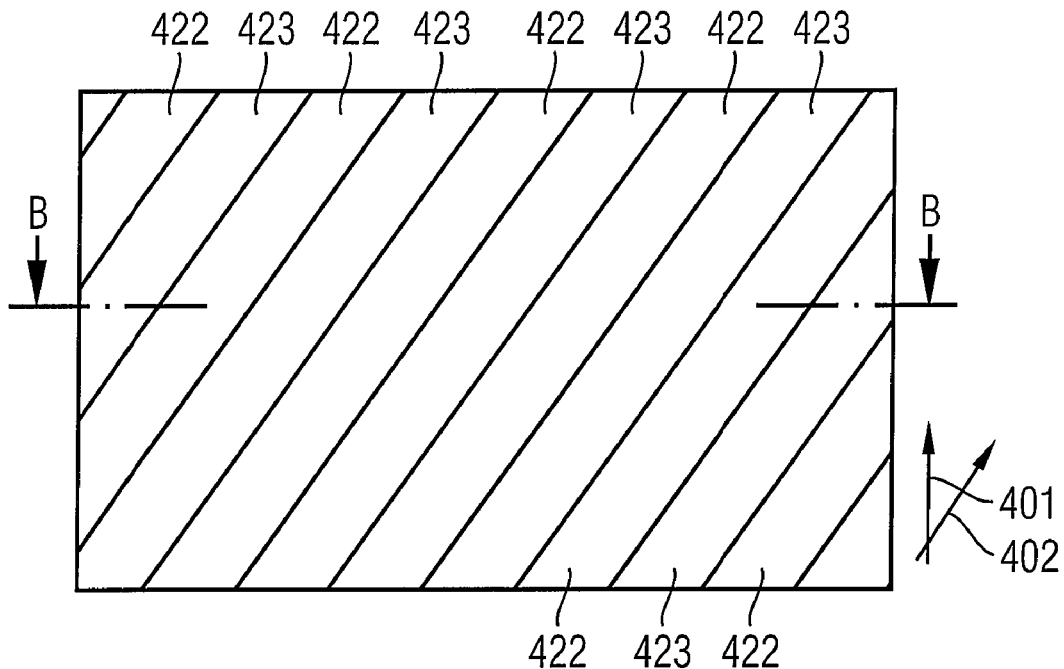
FIGS. 20A to 20B are a top view and a corresponding cross-sectional view of the substrate of FIGS. 19A to 19B after providing second mask lines and a planarizing step.

Referring to FIG. 20A, the spaces between neighboring sacrificial spaces 422 may be filled with a second fill material, which may be for example the same as the third material. A chemical-mechanical polishing step (CMP) may be performed to remove an overfill of the sacrificial spaces 422. A stop level of the CMP step may be provided at a height, at which the outer sidewalls of the sacrificial spaces 422 are essentially vertical in order to avoid an asymmetric etch bias in the following.

Figure 20B:
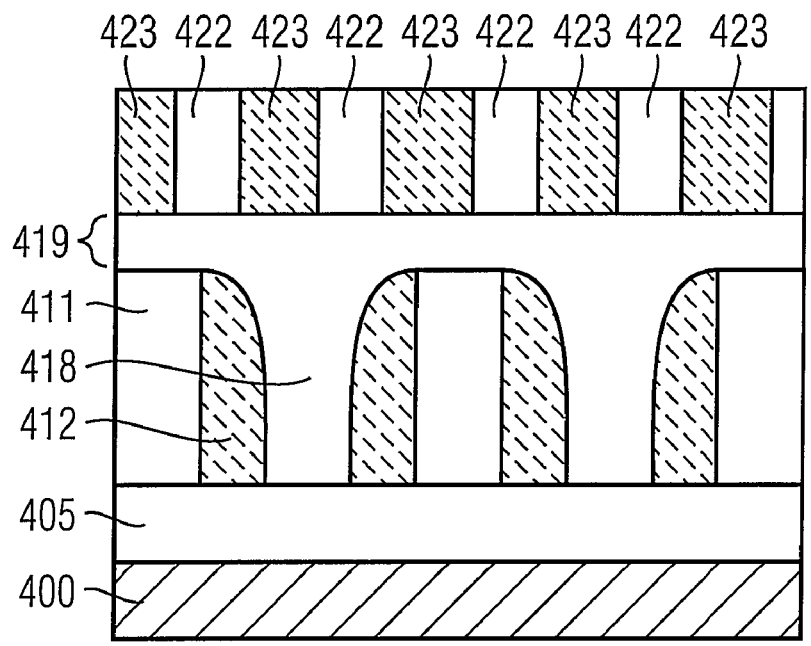

As illustrated in FIGS. 20A to 20B, the second mask lines 423 are formed between the sacrificial spacers 422, wherein the second mask lines 423 result alternatingly from the template lines 421 and the second mask fill.

Figure 21A:
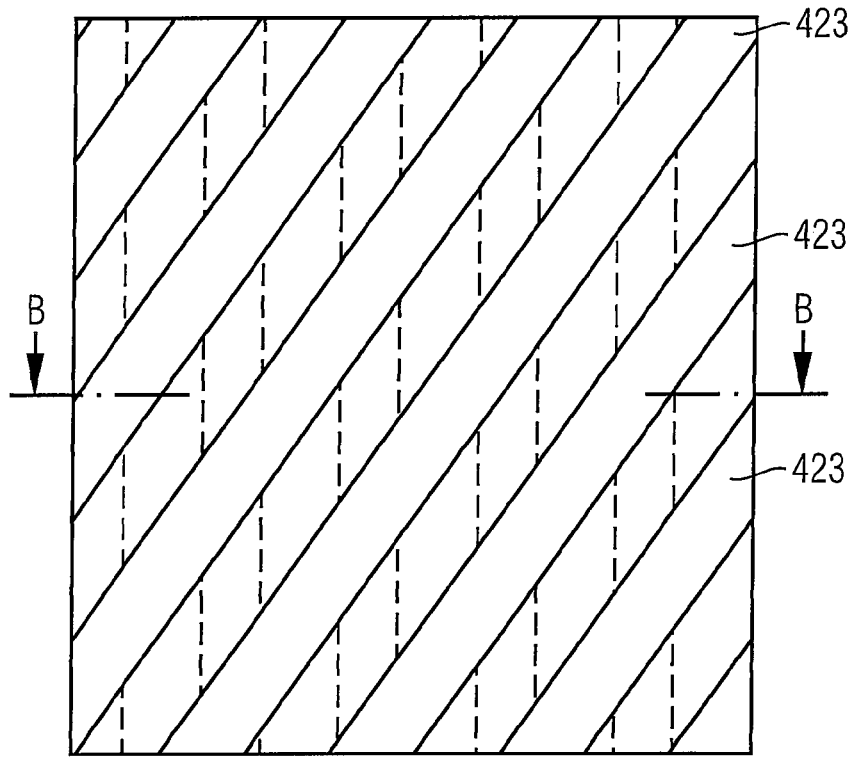
FIGS. 21A to 21B are a top view and a corresponding cross-sectional view of a mask arrangement and of the substrate of FIGS. 20A to 20B after providing the second mask.
Figure 21B:
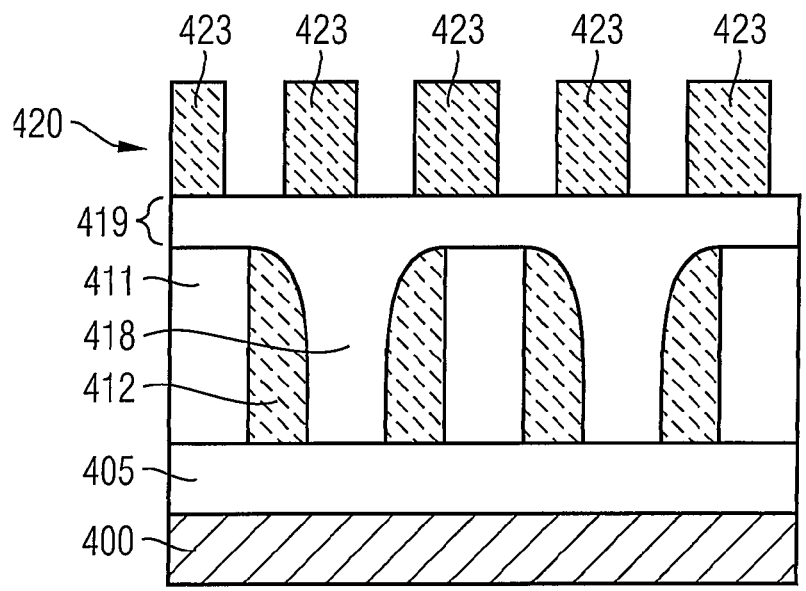

As illustrated in FIGS. 21A to 21B, the sacrificial spacers 422 may then be removed to form a second mask 420 above the first mask 410, wherein the second mask 420 comprises the second mask lines 423 resulting from the described line-by-fill pitch fragmentation method. The second mask lines 423 may have a width of F respectively and run along the second axis 402.

Figure 22A:
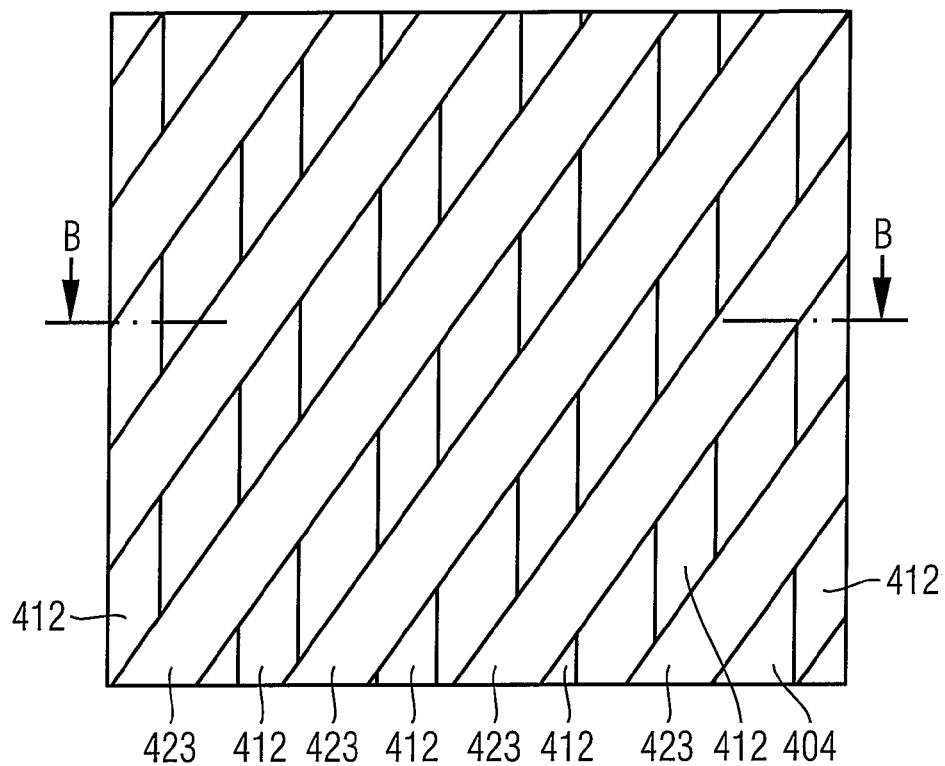
FIGS. 22A to 22B are a top view and a corresponding cross-sectional view of the substrate of FIGS. 21A to 21B after patterning the substrate.
Figure 22B:
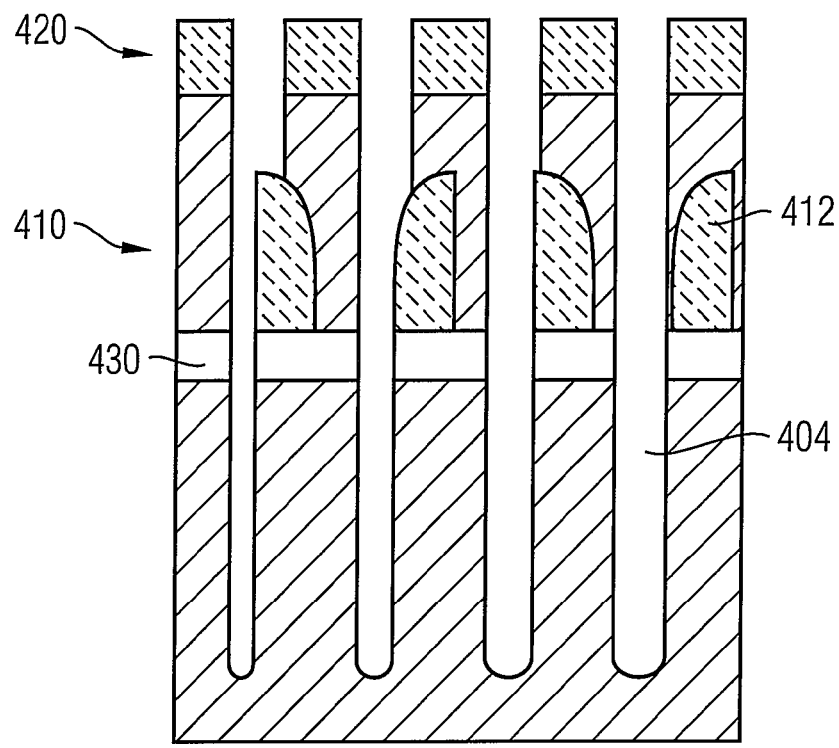

According to FIGS. 22A and 22B, the second mask 420 is used to etch the first mask overfill 419, the first mask fill 418 and the sacrificial lines 411, wherein the first mask 410 controls the etch in a lower section, such that the first mask 410 and the second mask 420 form a combined etch mask. Rhomb-shaped sections of the intermediate layer 430 are exposed between the first and second mask liners 412, 423.

As illustrated in FIG. 22B, trenches 404 may be formed in the substrate 400. Rhombs exposed by the combined mask 410, 420 are arranged along the first axis 401 and along a third axis intersecting the first axis 401 at an angle of about 65 degree to 75 degree, for example 68 degree. As the rhomb-shaped openings do not emerge directly from a lithographic mask pattern but from intersecting line patterns, rounding of the edges as common for direct lithographic patterning is no issue. Structures with a length of about 0.5 F and a width of about 0.5 F may be provided at a pitch of F in the substrate 400. As at least one of the masks 410, 420 results from a pitch fragmentation method, the minimum pitch of the buried structures along at least one direction may be half the minimum pitch of a conventionally formed buried structure. The buried structures 404 may be an array of contacts or of structures assigned to memory cells, for example a storage electrode of a capacitor of a DRAM memory cell. The cells of a sensor or memory cell array may be arranged in a two-dimensional matrix at a pitch of F. Contact arrays and/or chains may be provided at a pitch of F so as to fit with a densest line field, wherein the dimensions of the contacts are in the range of 0.5 F.

FIGS. 23A to 25B refer to an embodiment regarding a further method of manufacturing buried structures.

Figure 23A:
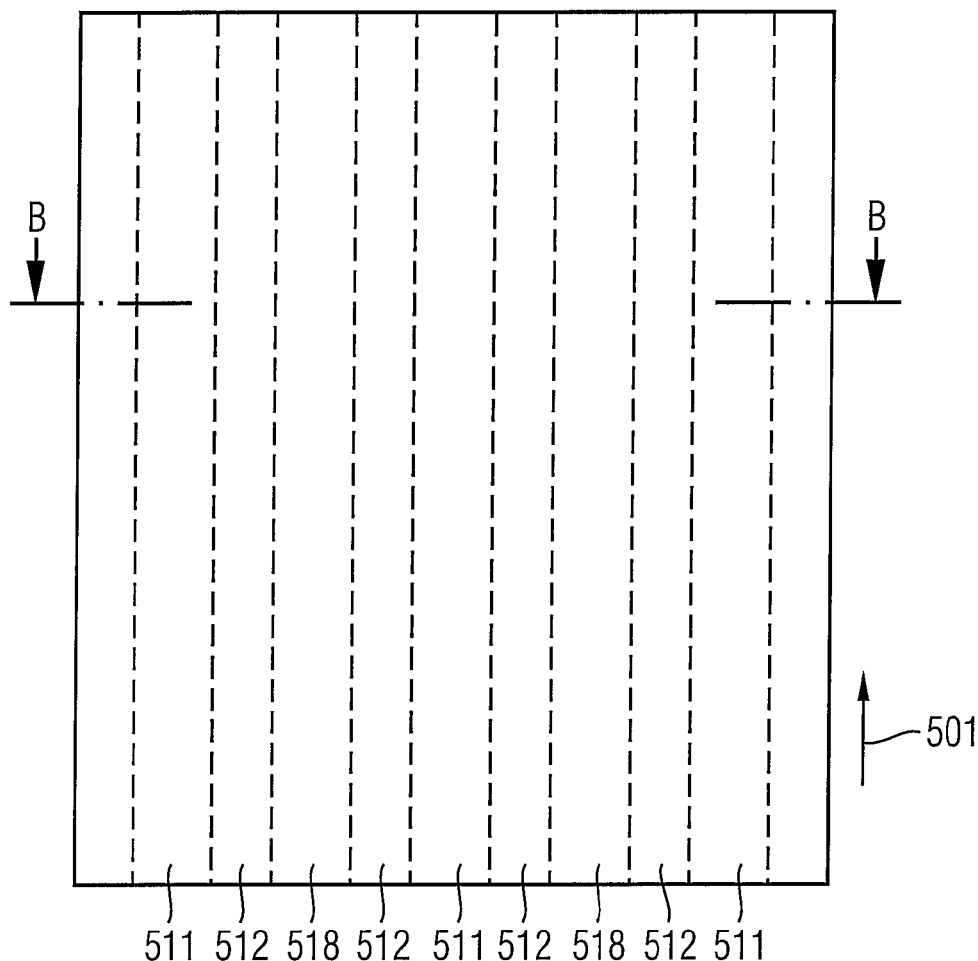
FIGS. 23A to 23B are a top view and a corresponding cross-sectional view of a substrate for illustrating a method of manufacturing buried structures according to a further embodiment of the invention after filling the first mask.
Figure 23B:
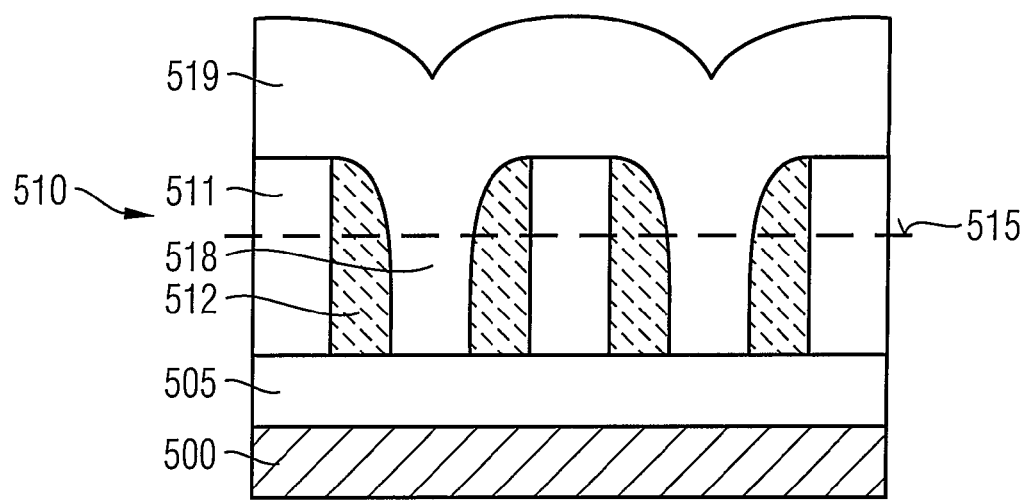

As illustrated in FIG. 23, above a pattern surface of a substrate 500, an intermediate layer 505 may be provided. A first mask 510 having first mask lines 512 elongating along vertical sidewalls of sacrificial lines 511 along a first axis 501 is provided above the substrate 500. A fill material is deposited such that a first mask fill 518 fills the spaces between the first mask lines 512 and a first mask overfill 519 is disposed above the sacrificial lines 511 and the mask lines 512. In the following, a chemical-mechanical polishing step may be performed that removes sections of the fill material 518, 519, the sacrificial lines 511 and the first mask lines 512 above an CMP stop level 515.

Figure 24A:
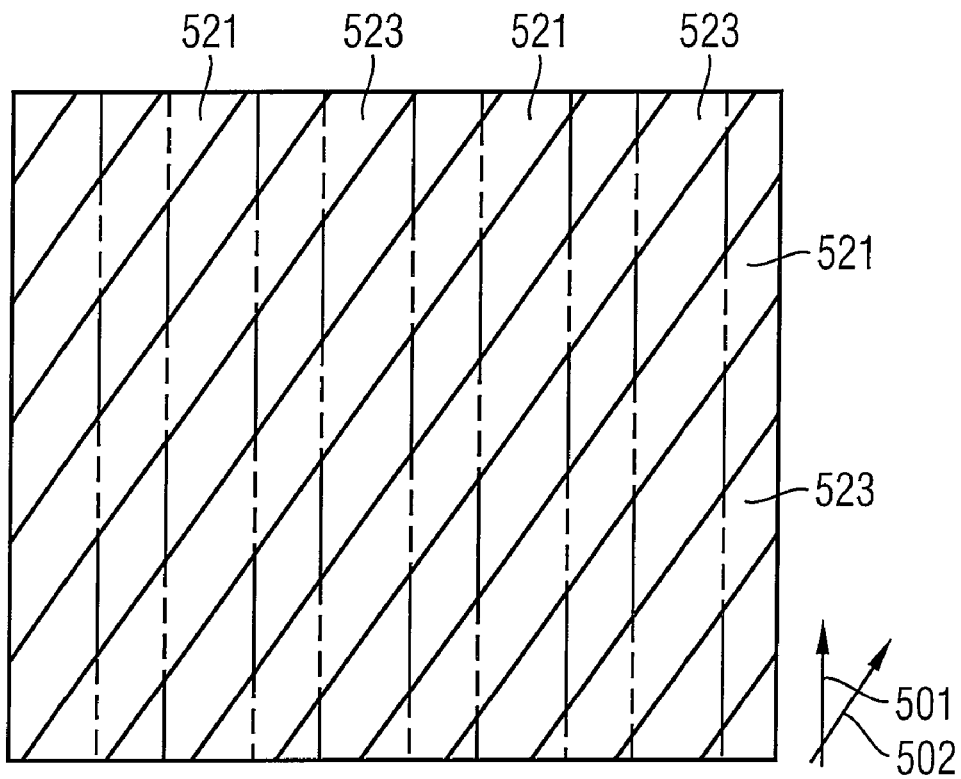
FIGS. 24A to 24B are a top view and a corresponding cross-sectional view of a mask arrangement and of the substrate of FIGS. 23A to 23B after providing the second mask.
Figure 24B:
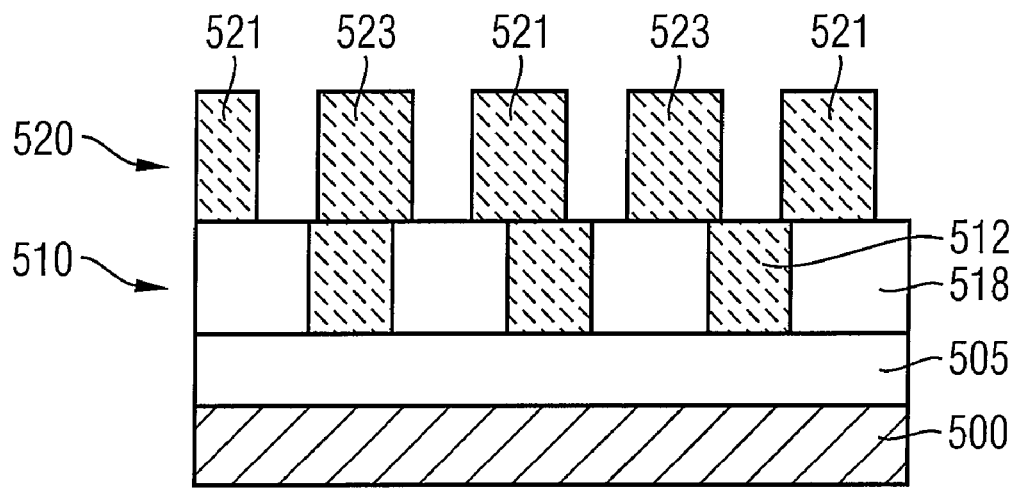
Figure 25A:
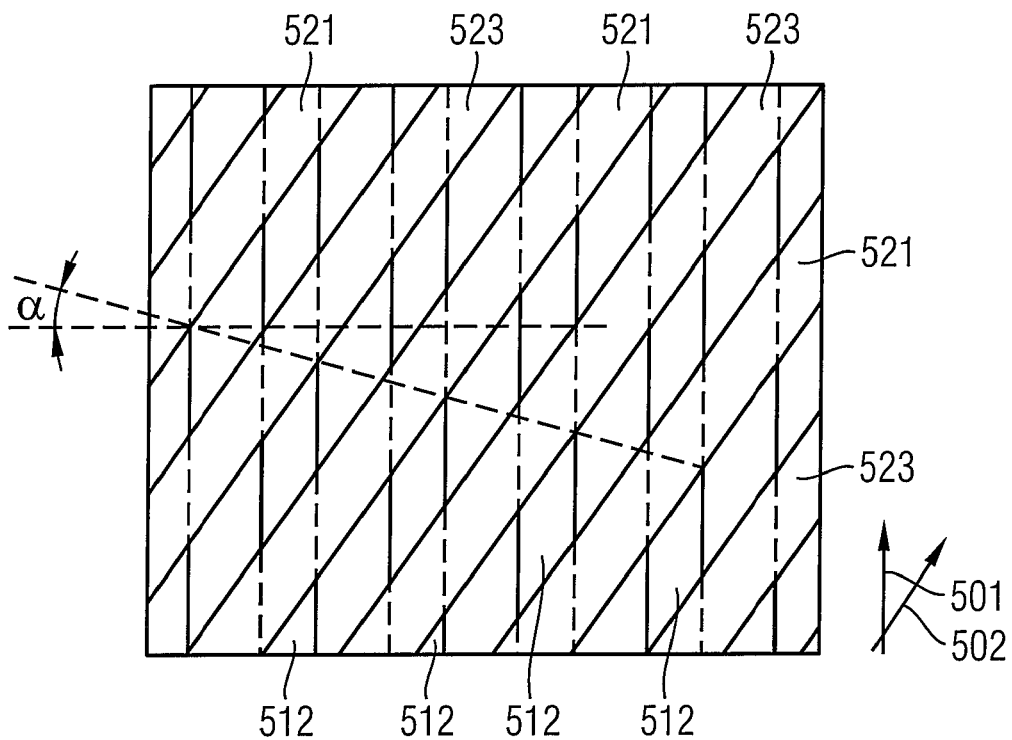
FIGS. 25A to 25B are a top view and a corresponding cross-sectional view of the substrate of FIGS. 24A to 24B after forming the buried structures.
Figure 25B:
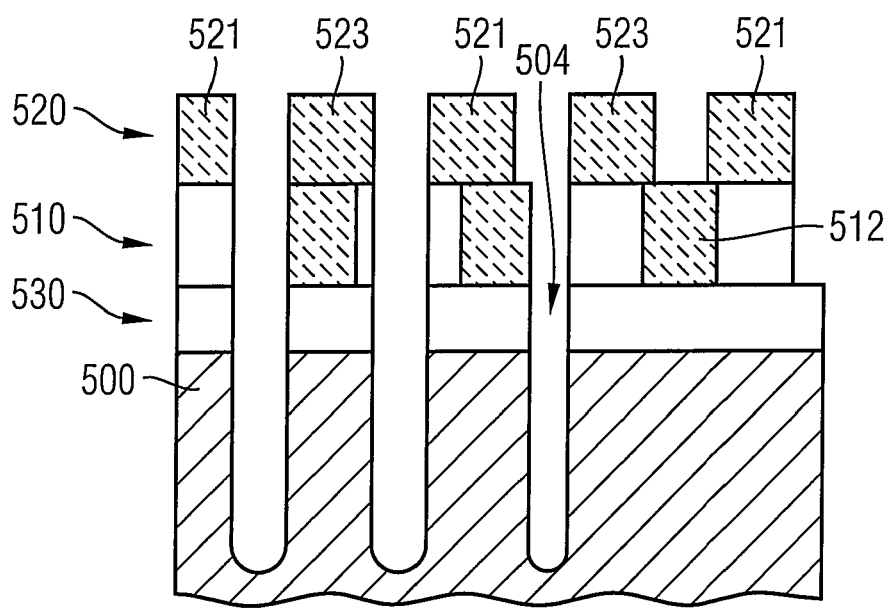

As illustrated in FIGS. 24A to 24B, a second mask 520 having second mask lines 523 may be provided above the first mask 510 in a similar way as described in detail with reference to the FIGS. 18B to 21B.

As illustrated in FIGS. 25A to 25D the first mask 510 and the second mask 520 may be used as a combined etch mask for exposing rhomb-shaped sections of the intermediate layer 530 or the substrate 500 between the first mask lines 511 and the second mask lines 523.

FIGS. 26A to 30D illustrate a method of forming dense contact chains according to a further embodiment.

Figure 26A:
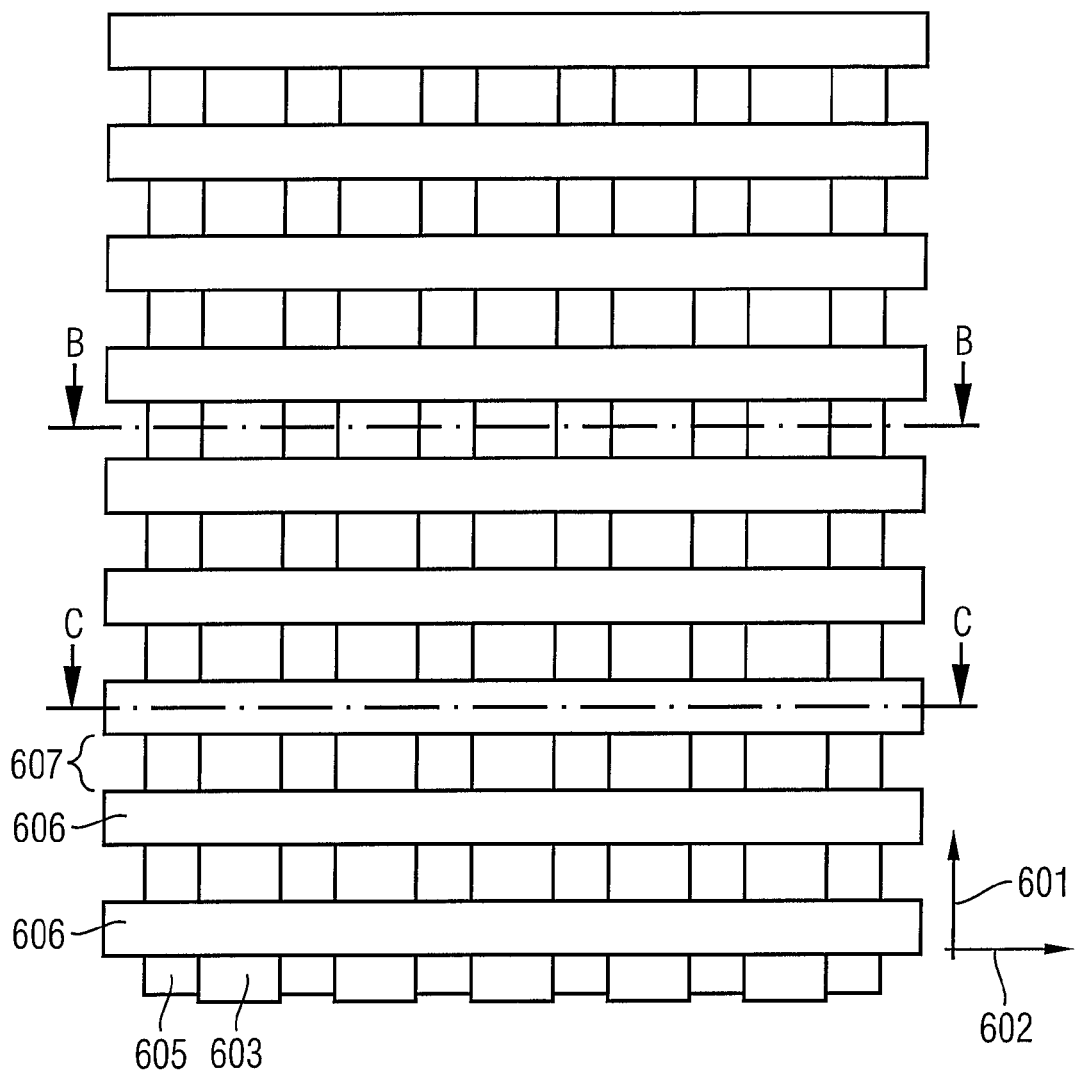
FIGS. 26A to 26C are a top view and two corresponding cross-sectional views of a substrate for illustrating a method of manufacturing a contact arrangement according to a further embodiment of the invention before providing a first mask.
Figure 26B:
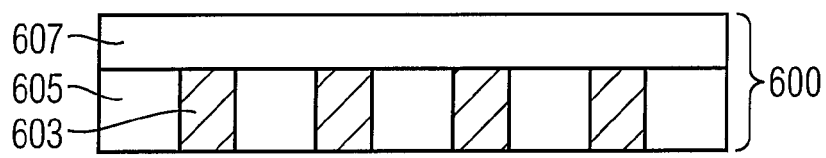
Figure 26C:
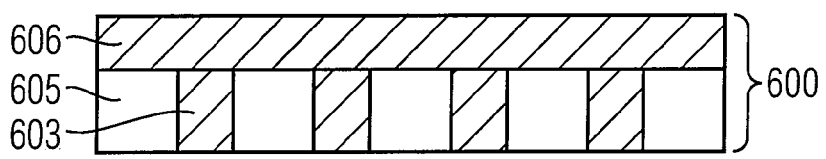

FIG. 26 illustrates a cell array, which may be a non-volatile cell array, for example a floating-gate NOR array. The substrate 600 includes buried contacts 603 that are embedded in an insulator structure 605. The buried contacts 603 may be active areas forming bitline terminals and may be heavily doped impurity regions assigned to cell transistors. The substrate 600 comprises further evenly spaced conductive lines 606 extending along a second axis 602 and insulator lines 607 separating in each case neighboring conductive lines 606. The conductive lines 606 may be word lines for addressing memory cells. The insulator lines 607 may be silicon oxide lines.

Figure 27:
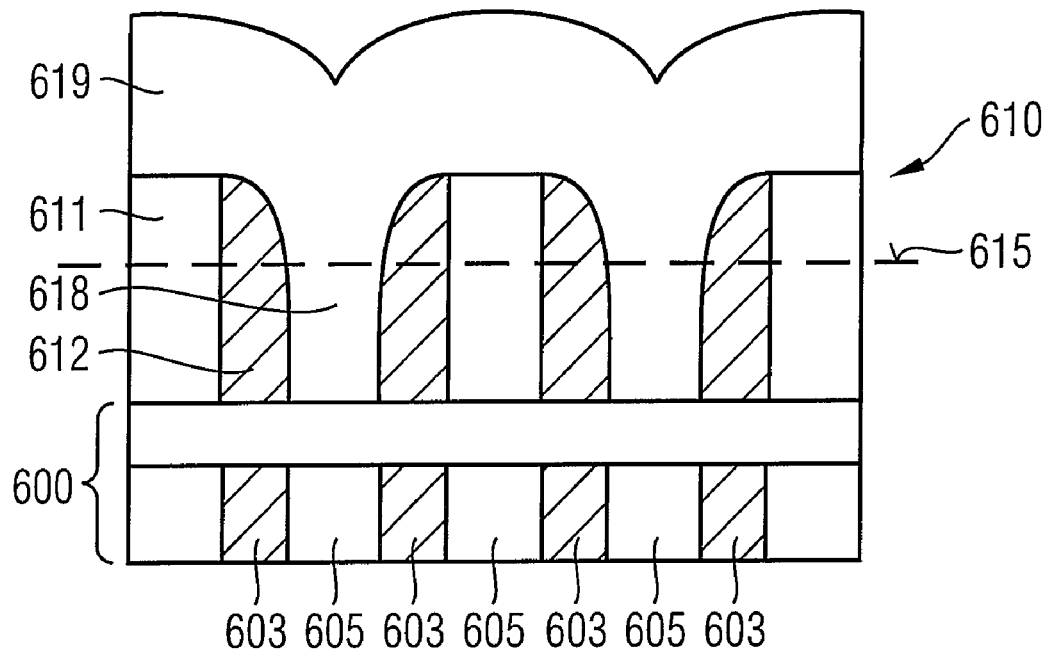
FIG. 27 is a cross-sectional view along cross-sectional line B-B of FIG. 26A after providing a first mask by a pitch fragmentation method and filling the first mask.

According to FIG. 27, template lines 611 may be formed above the substrate 600. The template lines 611 extend along a first axis 601 that is perpendicular to the second axis 602. Sacrificial spacers 612 may be provided along vertical sidewalls of the template lines 611. A fill material may be deposited such that at least the spaces between neighboring sacrificial spacers 612 are filled. A first mask overfill 619 may cover the template lines 611 and the sacrificial spacers 612. In the following, the first mask overfill 619, portions of the first mask fill 618, the template lines 611 and the sacrificial spacers 612 above a polish stop line 615 may be removed.

Figure 28:
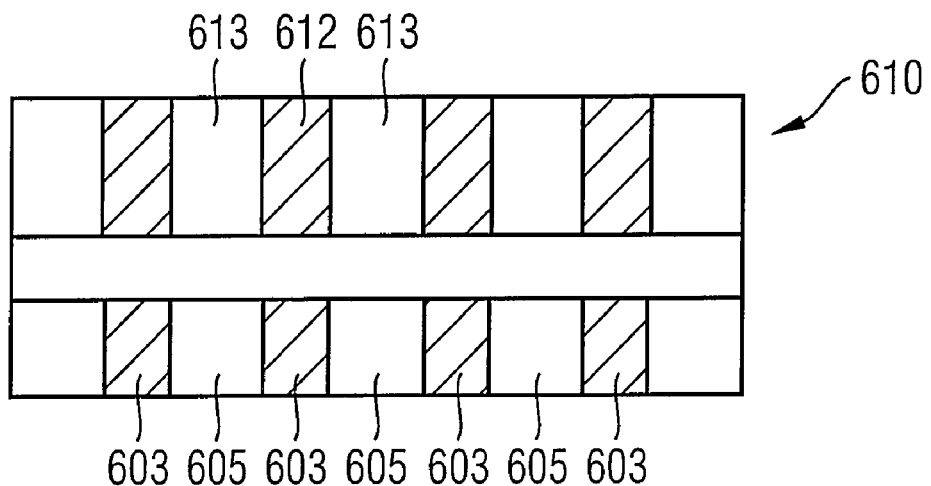
FIG. 28 is a cross-sectional view of the substrate of FIGS. 26A to 26C along cross-sectional line B-B after a planarizing step.

The result of the chemical-mechanical polishing step is illustrated in FIG. 28. Evenly spaced first mask lines 613 emerging alternatingly from the template lines 611 and the first mask fill 618 are separated by structures resulting from the sacrificial spacers 612. In this way, a first mask 610 having the first mask lines 613 is provided through a line-by-fill pitch fragmentation method.

Figure 29A:
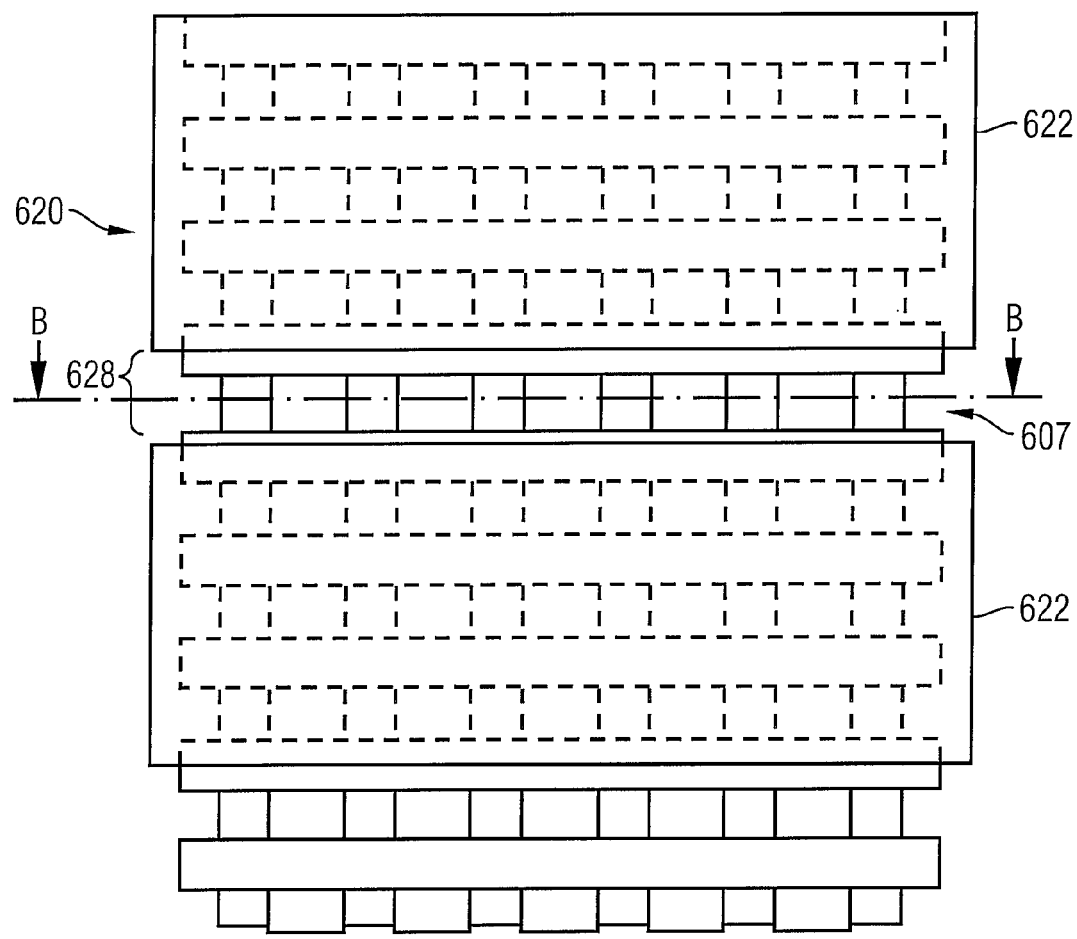
FIGS. 29A to 29B are a top view and a corresponding cross-sectional view along cross-section line B-B of the substrate of FIG. 28 after providing a second mask.
Figure 29B:
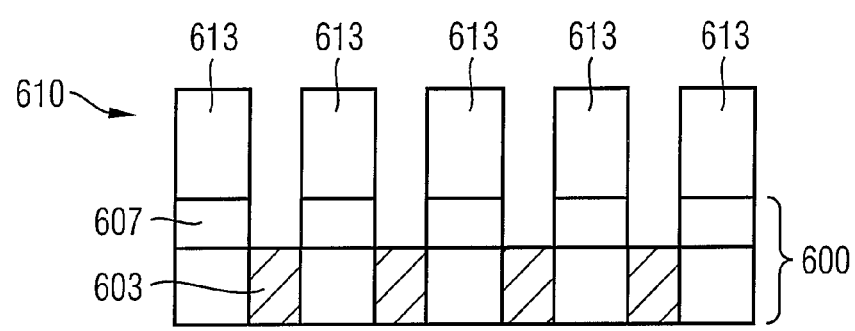

Referring to FIG. 29, a second mask 620 is provided above the filled and polished structure of FIG. 28. The second mask 620 includes second mask lines 622 extending along the second axis 602. Between the second mask lines 622 a trim opening 628 extends along the second axis 602 and exposes first mask lines 613 and structures resulting from the sacrificial spacers 612 above one of the insulator lines 607. Using the second mask 620 and the first mask 610 as combined etch mask, the exposed structures resulting from the sacrificial spacers 612 are removed in the regions exposed by the trim opening 628, wherein sections of the insulator lines 607 are exposed. Then, as illustrated in FIG. 29B, the exposed sections of the insulator line 607 may be etched to expose the buried contacts 603.

Figure 30A:
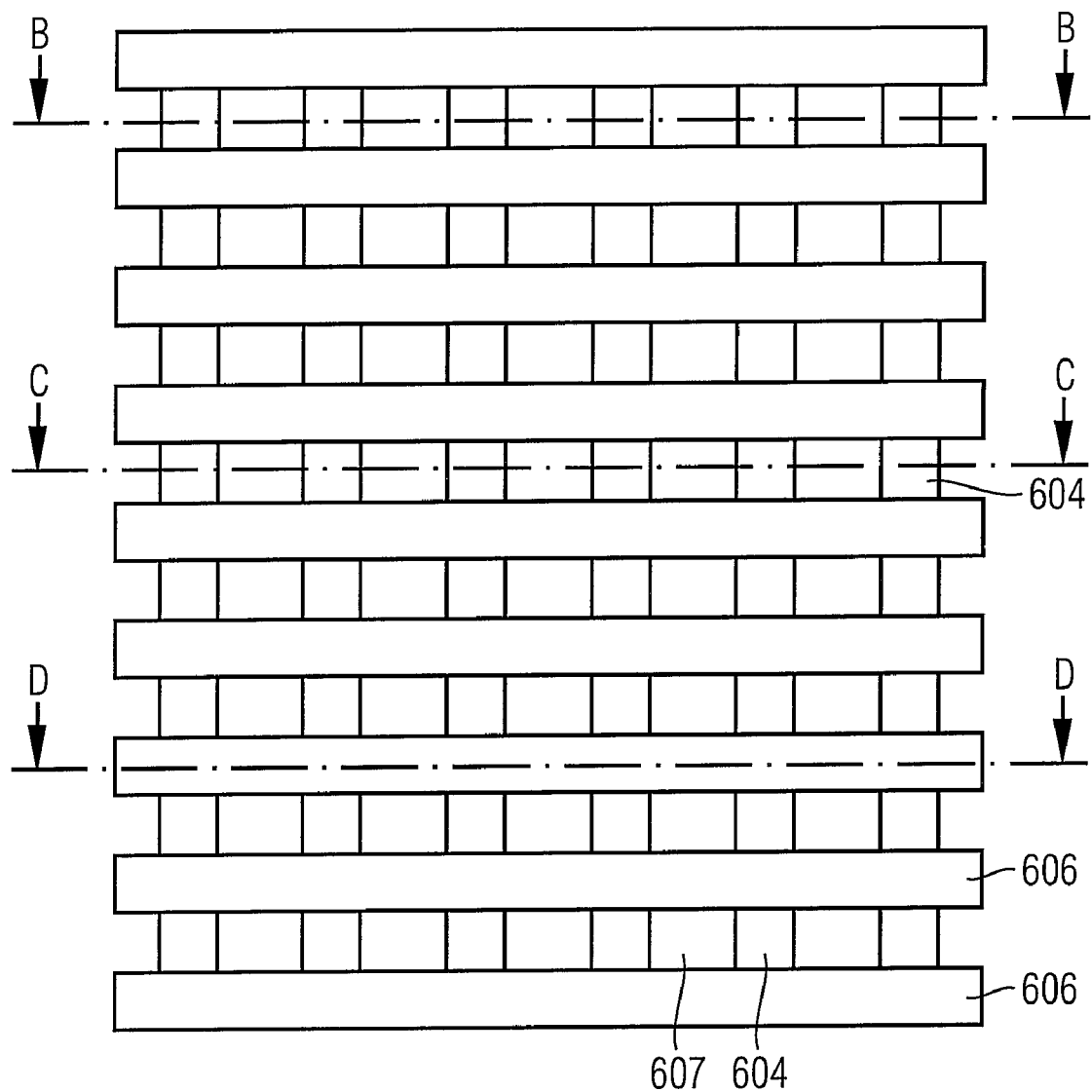
FIGS. 30A to 30D are a top view and three corresponding cross-sectional views of the substrate of FIGS. 29A to 29B after removing the masks.
Figure 30B:
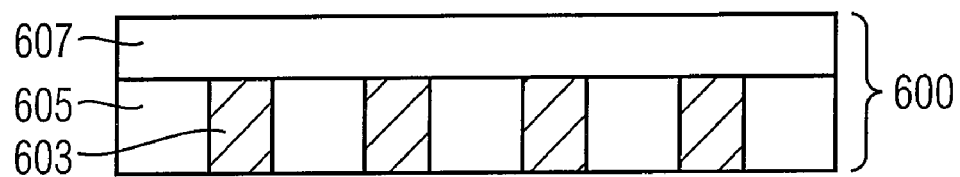
Figure 30C:
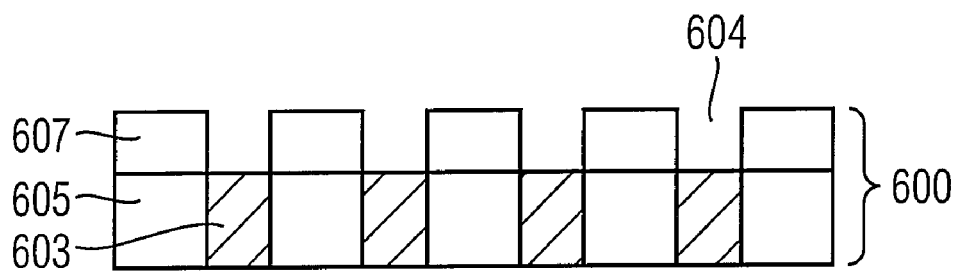

The resulting structure is illustrated in FIG. 30A. FIG. 30B illustrates a cross-section B-B along an insulator line 607 that is covered by the second mask lines 622. FIG. 30C illustrates the cross-section C-C along one of the insulator lines 607 which is exposed by the trim opening 628. Below this insulator line, the buried contacts 603 are exposed.

Figure 30D:
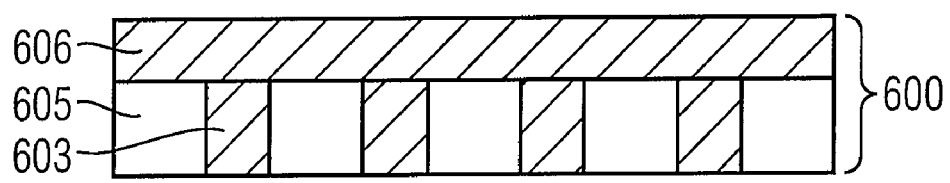

As the etch may be selective against the material of the word lines, even the word lines neighboring the exposed insulator lines 607 remain unaffected as illustrated in FIG. 30D.

Figure 31:
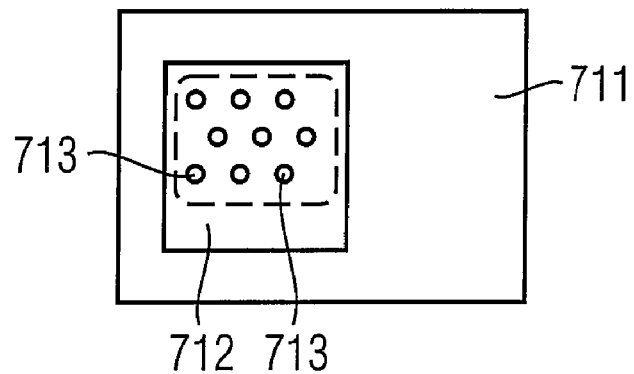
FIG. 31 is a schematic illustration of an electronic system according to a further embodiment.

FIG. 31 is a schematic illustration of an electronic system 711. The electronic system 711 comprises a memory cell array 712. The memory cell array 712 includes evenly spaced rows of evenly spaced capacitors 713. The rows are alternatingly shifted by one half a capacitor pitch within the rows. The capacitor pitch is smaller than 2×F, wherein F is equal to a minimum lithographic feature size for evenly spaced lines. The electronic system 711 may be an audio system, a video system, a graphic card of a computer system, a computer system, as for example a server, a communication system, for example a cell phone, an imaging system, for example a digital camera, a data storage system, for example a data storage module for a computer systems or a portable data storage device.

Figure 32:
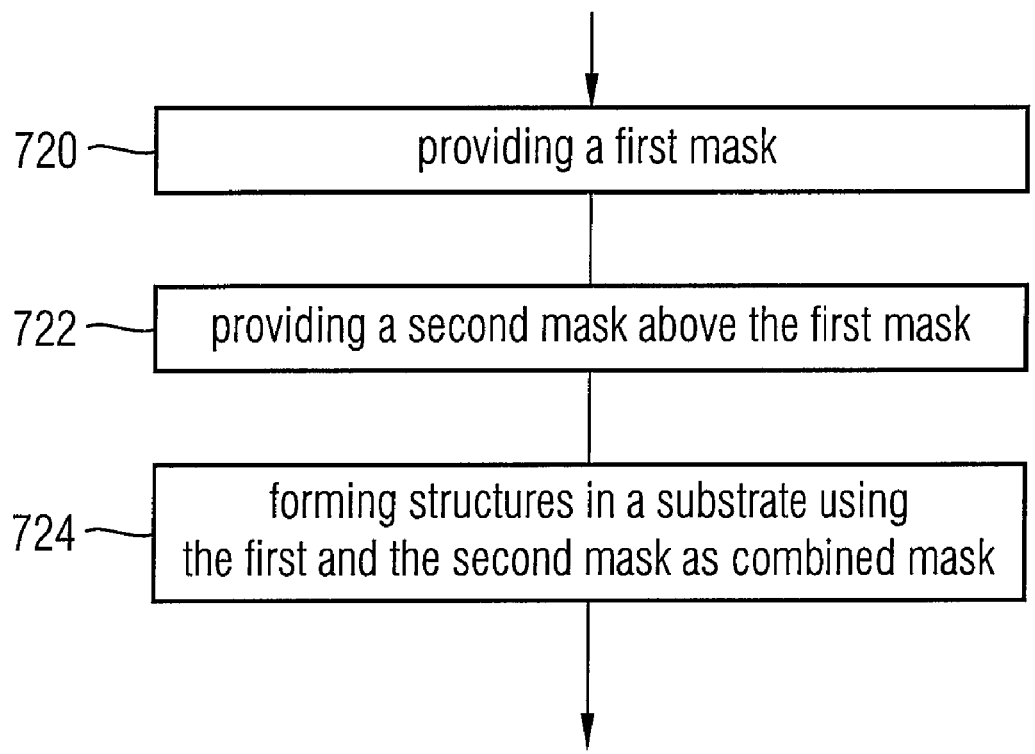
FIG. 32 is a simplified flow-chart illustrating a method of manufacturing a buried structure according to another embodiment.

FIG. 32 is a simplified flow chart of a method of manufacturing buried structures. A first mask is provided above a substrate (720). The first mask includes first mask lines that extend along a first axis. A second mask is provided above the first mask (722). The second mask includes second mask lines that extend along a second axis that intersect the first axis. At least one of the first and second masks is formed by a pitch fragmentation method. Using the first and the second mask as a combined mask, buried structures are formed in the substrate (724).

Figure 33:
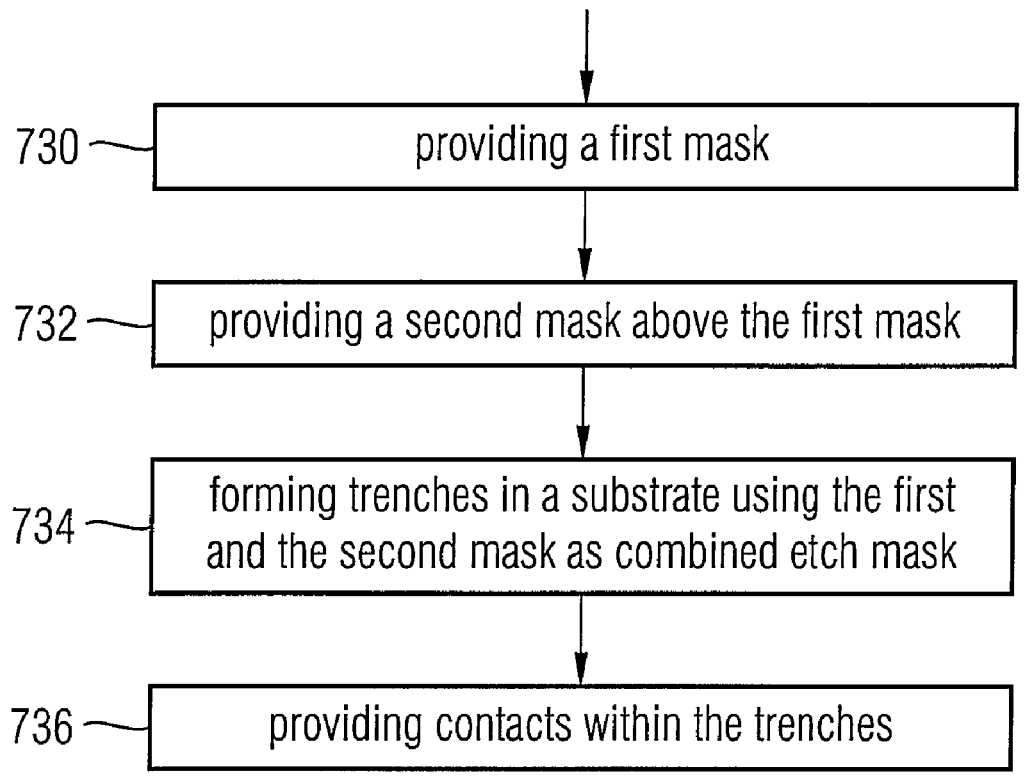
FIG. 33 is a simplified flowchart illustrating a method of manufacturing a contact arrangement according to a further embodiment.

FIG. 33 is a simplified flow chart of a further method of manufacturing contacts. A first mask is provided above a substrate by a pitch fragmentation method (730). The first mask includes first mask lines that extend along a first axis. Above the first mask a second mask is provided (732). The second mask includes second mask lines that extend along a second axis that intersects the first axis. Using the first and the second mask as a combined etch mask, trenches are formed in the substrate (734). Within the trenches contacts are provided (736).

Figure 34:
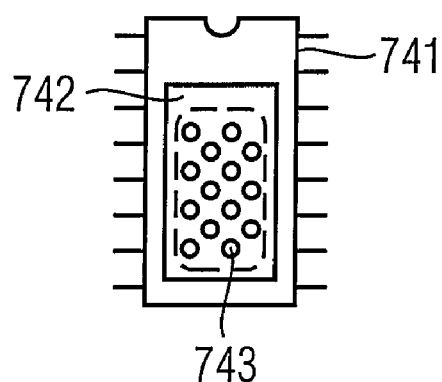
FIG. 34 is a schematic illustration of an integrated circuit according to a further embodiment.

FIG. 34 is a schematic illustration of an integrated circuit 741. The integrated circuit 741 includes a memory cell array 742. The memory cell array 742 includes evenly spaced rows of evenly spaced capacitors 743. The rows are alternatingly shifted by one half a capacitor pitch within the rows. The capacitor pitch is smaller than 2×F, wherein F is equal to a minimum lithographic feature size for evenly spaced lines. The integrated circuit may be a SoC with embedded memory, a DRAM, for example a graphics DRAM, a consumer DRAM or a cellular DRAM.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing semiconductor structures, comprising:
providing a first mask above a substrate, the first mask comprising first mask lines extending along a first axis;
providing a second mask above the first mask, the second mask comprising second mask lines extending along a second axis intersecting the first axis, wherein at least one of the first and second mask is formed by a pitch fragmentation method; and
forming structures in the substrate using the first and the second mask as a combined mask.

2. The method of claim 1, wherein forming structures comprises forming trenches in the substrate using the first and the second mask as a combined etch mask.

3. The method of claim 1, wherein providing the first mask comprises:
providing first sacrificial lines of a sacrificial material, the first sacrificial lines extending along the first axis; and
providing sidewall spacers on vertical sidewalls of the first sacrificial lines, the sidewall spacers forming the first mask lines.

4. The method of claim 3, wherein the first sacrificial lines are removed in sections exposed by the second mask before forming the structures.

5. The method of claim 3, wherein the first mask comprises template patterns arranged in a template row along the second axis, each template pattern being confined by two of the first mask lines on opposing first sides and by two transverse mask lines extending along the second axis on opposing second sides, wherein the second axis is perpendicular to the first axis; and
the second mask comprises a trim opening above the template row, the trim opening exposing at least sections of the first mask lines.

6. The method of claim 5, wherein each template pattern is a template opening exposing a section of the substrate.

7. The method of claim 5, wherein each template pattern is a template mesa covering a section of the substrate.

8. The method of claim 5, wherein a template length of the template pattern along the first axis exceeds a trim width of the trim opening along the first axis by at least 5 percent; and
the trim opening exposes sections of the first sacrificial lines between the first mask lines, wherein the trim width determines a length of the structures along the first axis.

9. The method of claim 6, wherein a trim width of the trim opening along the first axis exceeds a template length of the template pattern along the first axis by at least 5 percent; and
the trim opening exposes sections of the first sacrificial lines between the first mask lines, wherein the template length determines a length of structures assigned to the template openings and the trim width determines a length of the structures formed between the template patterns, the lengths defined along the first axis.

10. The method of claim 6, wherein a trim width of the trim opening along the first axis varies between a first trim width above the template patterns and a second trim width between the template patterns, wherein the first trim width exceeds a template length of the template pattern along the first axis and the second trim width is essentially equal to the template length; and
the trim opening exposes sections of the first sacrificial lines between the first mask lines, wherein the template length determines a length of structures resulting from the template openings and the second trim width determines a minimum length of structures formed between the template patterns, the lengths defined along the first axis.

11. The method of claim 3, wherein the first mask comprises template patterns arranged in a template row along the second axis, each template pattern being confined by two of the first mask lines on opposing first sides and by two transverse mask lines extending along the second axis on opposing second sides, wherein the second axis is perpendicular to the first axis; and
the second mask comprises a plurality of trim openings arranged along the template row, each trim opening exposing a section of one of the first sacrificial lines between the first mask lines.

12. The method of claim 11, wherein the trim openings have a trim width along the first axis and a trim length along the second axis, the trim width being essentially equal to a template length of the template pattern along the first axis and the trim length being essentially equal to a template width of the template pattern along the second axis.

13. The method of claim 2, further comprising:
providing an intermediate layer on the substrate before providing the first mask, wherein forming trenches in the substrate comprises:
patterning the intermediate layer using the first and the second mask as a combined etch mask to form an intermediate mask from the intermediate layer;
removing residual portions of the first and second masks; and
forming the trenches in the substrate using the intermediate mask as an etch mask.

14. The method of claim 1, further comprising:
filling the first mask with a fill material before providing the second mask.

15. The method of claim 1, wherein providing the second mask comprises:
providing second sacrificial lines of a sacrificial material above the substrate; and
providing sidewall spacers on vertical sidewalls of the second sacrificial lines to form the second mask lines.

16. The method of claim 1, wherein providing the first mask comprises:
providing first template lines extending along the first axis above the substrate;
providing sacrificial sidewall spacers of a sacrificial material on vertical sidewalls of the first template lines; and
providing the first mask lines between the sacrificial sidewall spacers.

17. The method of claim 14, wherein providing the second mask comprises:
providing second template lines extending along the second axis above the first mask;
providing sacrificial sidewall spacers of a sacrificial material on vertical sidewalls of the second template lines; and
providing the second mask lines between the sacrificial sidewall spacers.

18. The method of claim 17, wherein the sacrificial material and the fill material are selectively etchable against the first and second mask lines.

19. The method of one claims 17, wherein the sacrificial material is the same as the fill material.

20. The method of claim 1, wherein providing the second mask comprises:
overfilling the first line mask such that portions of the fill material cover the first line mask; and
planarizing the fill material.

21. The method of claim 20, wherein the step of planarizing stops below an upper edge of the first mask lines.

22. The method of claim 1, wherein the second axis intersects the first axis at an angle of 20 to 25 degree.

23. A method of manufacturing contact structures, comprising:
- providing a first mask above a substrate using a pitch fragmentation method, the first mask comprising sections forming first mask lines extending along a first axis;
- providing a second mask above the first mask, the second mask comprising second mask lines extending along a second axis intersecting the first axis;
- forming trenches in the substrate using the first and the second mask as a combined etch mask; and
- providing contact structures within the trenches.

24. The method of claim 23, wherein providing the first mask includes:
- providing sacrificial lines of a sacrificial material, the sacrificial lines extending along the first axis; and
- providing sidewall spacers on vertical sidewalls of the sacrificial lines, the sidewall spacers forming the first mask lines.

25. The method of claim 24, wherein the sacrificial lines are removed in sections exposed by the second mask before etching the trenches.

26. The method of claim 23, wherein the first mask comprises template patterns arranged in a template row along the second axis, each template pattern being confined by two of the first mask lines on opposing first sides and two transverse mask lines extending along the second axis on opposing second sides, wherein the second axis is perpendicular to the first axis; and
- the second mask comprises a trim opening extending above the template row, the trim opening exposing at least sections of the first mask lines.

27. The method of claim 26, wherein each template pattern is a template opening exposing a section of the substrate.

28. The method of claim 26, wherein each template pattern is a template mesa covering a section of the substrate.

29. The method of claim 26, wherein the edges of the trim opening are disposed above one of the transverse mask lines respectively; and
- the trim opening exposes sections of the first sacrificial lines between the first mask lines, wherein a template length between opposing transverse mask lines defines a length of contact structures resulting from the template patterns.

30. The method of claim 27, wherein a template length between opposing transverse mask lines exceeds a trim width of the trim opening along the first axis;
- the trim opening exposes sections of the sacrificial lines between the first mask lines; and
- the trim width determines a length of the contact structures along the first axis.

31. The method of claim 27, wherein a trim width of the trim opening along the first axis varies between a first trim width above the template openings and a second trim width between the template openings, wherein the first trim width exceeds a template length between the transverse mask lines and the second trim width is essentially equal to the template length; and
- the trim opening exposes sections of the sacrificial lines between the first mask lines such that the template length determines a length of contact structures resulting from the template openings and the second trim width determines a minimum length of contact structures formed between the template patterns, the lengths defined in each case along the first axis.

32. The method of claim 23, wherein the first mask comprises template openings arranged in a template row along the second axis, each template pattern being confined by two of the first mask lines on opposing sides, wherein the second axis is perpendicular to the first axis; and
- the second mask comprises trim openings arranged along the template row, each trim opening exposing a section of one of the sacrificial mask between the first mask lines.

33. The method of claim 32, wherein the trim openings have a trim width along the first axis and a trim length along the second axis, the trim width being essentially equal to a template length of the template openings along the first axis and the trim length being essentially equal to a template width of the template openings along the second axis.

34. The method of claim 1, further comprising:
- providing an intermediate layer on the substrate before providing the first mask, wherein forming trenches in the substrate comprises:
- patterning the intermediate layer using the first and the second mask as a combined etch mask to form an intermediate mask from the intermediate layer;
- removing residual portions of the first and second masks; and
- forming the trenches in the substrate using the intermediate mask as an etch mask.

* * * * *